(12) United States Patent
Lin et al.

(10) Patent No.: US 11,728,399 B2
(45) Date of Patent: Aug. 15, 2023

(54) FLASH MEMORY DEVICE INCLUDING A BURIED FLOATING GATE AND A BURIED ERASE GATE AND METHODS OF FORMING THE SAME

(71) Applicant: Taiwan Semiconductor Manufacturing Company Limited, Hsinchu (TW)

(72) Inventors: Yu-Chu Lin, Tainan (TW); Chia-Ming Pan, Tainan (TW); Chi-Chung Jen, Kaohsiung (TW); Wen-Chih Chiang, Hsinchu (TW); Keng-Ying Liao, Tainan (TW); Huai-jen Tung, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 13 days.

(21) Appl. No.: 17/496,839

(22) Filed: Oct. 8, 2021

(65) Prior Publication Data

US 2022/0028993 A1     Jan. 27, 2022

Related U.S. Application Data

(62) Division of application No. 16/852,654, filed on Apr. 20, 2020, now Pat. No. 11,183,572.

(51) Int. Cl.
*H01L 21/28* (2006.01)
*H01L 29/788* (2006.01)
(Continued)

(52) U.S. Cl.
CPC .. *H01L 29/42328* (2013.01); *H01L 29/40114* (2019.08); *H01L 29/66825* (2013.01); *H01L 29/7883* (2013.01); *H10B 41/30* (2023.02)

(58) Field of Classification Search
None
See application file for complete search history.

(56) References Cited

U.S. PATENT DOCUMENTS

| 6,078,076 A | 6/2000 | Lin et al. |
| 6,344,393 B1 | 2/2002 | Liu |

(Continued)

FOREIGN PATENT DOCUMENTS

| JP | 2010267341 A | 11/2010 |
| KR | 10-2008-0049517 | 6/2008 |

(Continued)

OTHER PUBLICATIONS

Korean Patent and Trademark Office, Application No. 10-2022-0041729, Office Action dated Jul. 29, 2022, 6 pages.

(Continued)

*Primary Examiner* — Xiaoming Liu
(74) *Attorney, Agent, or Firm* — The Marbury Law Group, PLLC

(57) ABSTRACT

A flash memory device includes a floating gate electrode formed within a substrate semiconductor layer having a doping of a first conductivity type, a pair of active regions formed within the substrate semiconductor layer, having a doping of a second conductivity type, and laterally spaced apart by the floating gate electrode, an erase gate electrode formed within the substrate semiconductor layer and laterally offset from the floating gate electrode, and a control gate electrode that overlies the floating gate electrode. The floating gate electrode may be formed in a first opening in the substrate semiconductor layer, and the erase gate electrode may be formed in a second opening in the substrate semiconductor layer. Multiple instances of the flash memory device may be arranged as a two-dimensional array of flash memory cells.

20 Claims, 16 Drawing Sheets

(51) Int. Cl.
    *H01L 29/423*     (2006.01)
    *H01L 29/66*     (2006.01)
    *H10B 41/30*     (2023.01)

(56) References Cited

U.S. PATENT DOCUMENTS

| | | |
|---|---|---|
| 6,878,991 B1 | 4/2005 | Forbes |
| 2008/0128785 A1 | 6/2008 | Park et al. |
| 2009/0166708 A1 | 7/2009 | Io |
| 2011/0134698 A1 | 6/2011 | Mazure et al. |
| 2015/0036437 A1 | 2/2015 | Li et al. |
| 2017/0117372 A1* | 4/2017 | Li ................... H01L 27/11534 |
| 2017/0317093 A1* | 11/2017 | Wang ............... H01L 27/11521 |
| 2019/0214397 A1 | 7/2019 | Xing et al. |

FOREIGN PATENT DOCUMENTS

| | | |
|---|---|---|
| KR | 10-2008-0049517 A | 6/2008 |
| KR | 20080049517 A | 6/2008 |
| TW | 201603244 A | 1/2016 |
| TW | 201841349 A | 11/2018 |

OTHER PUBLICATIONS

German Patent and Trademark Office, Application No. 102020111644.6 Examination Report dated Jan. 13, 2021, 8 pages.
Korean Patent and Trademark Office, Application No. 10-2020-0092480; Office Action dated May 31, 2021, 8 pages.
Korean Patent and Trademark Office, Application No. 10-2020-0092480, Office Action dated Dec. 20, 2021, 3 pages.
Korean Patent and Trademark Office, Application No. 10-2020-0092480, Office Action dated Mar. 3, 2022, 3 pages.
Korean Patent and Trademark Office, Application No. 10-2022-0041729, First Examination Report dated Jan. 30, 2023, 6 pages.

* cited by examiner

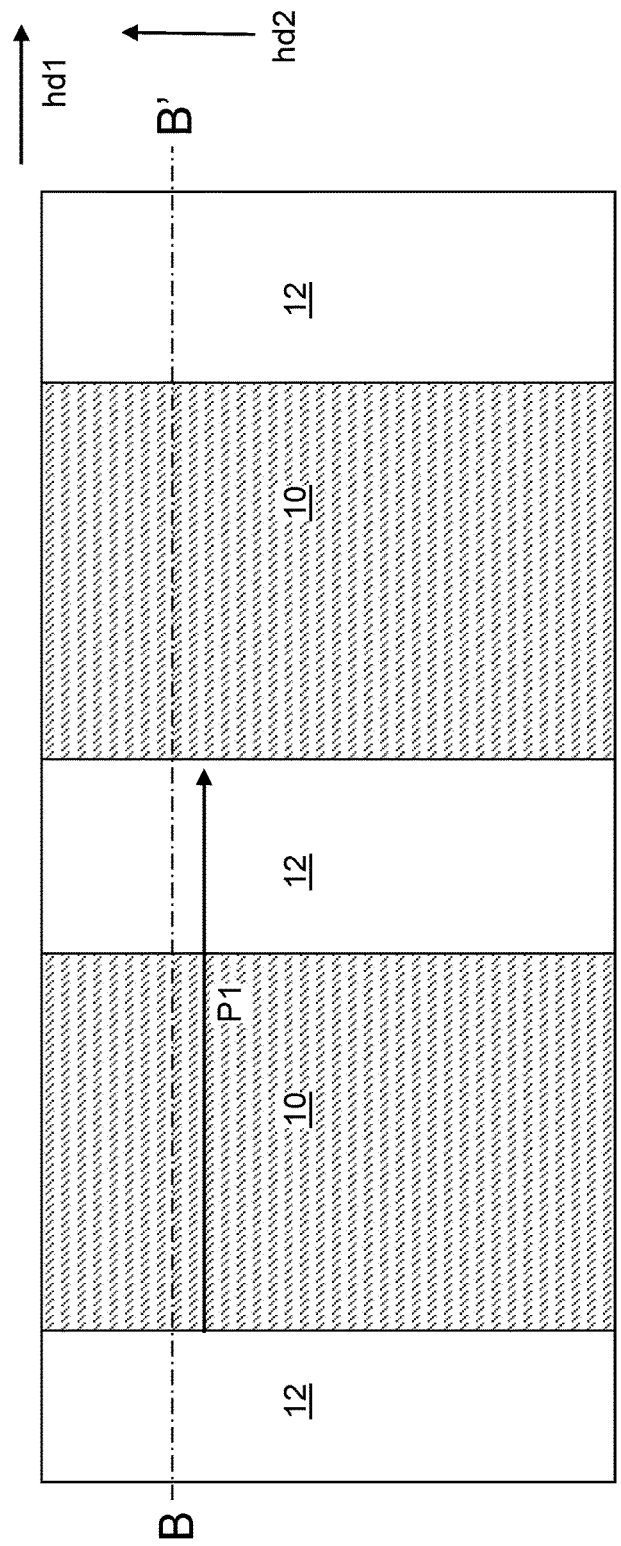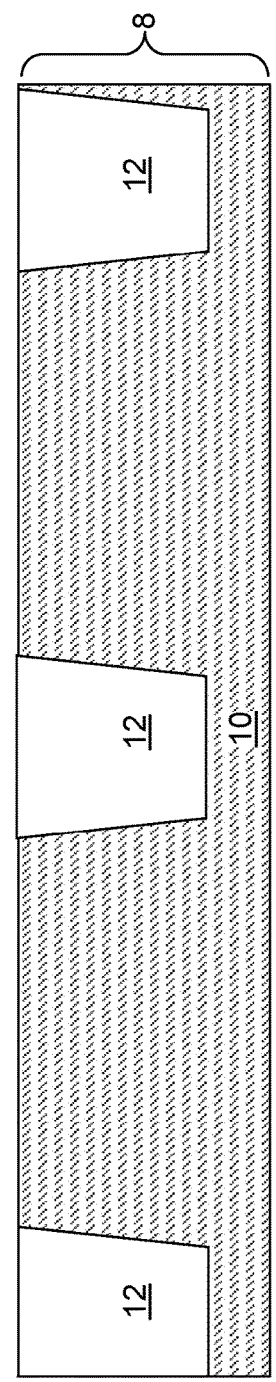
FIG. 1A
FIG. 1B

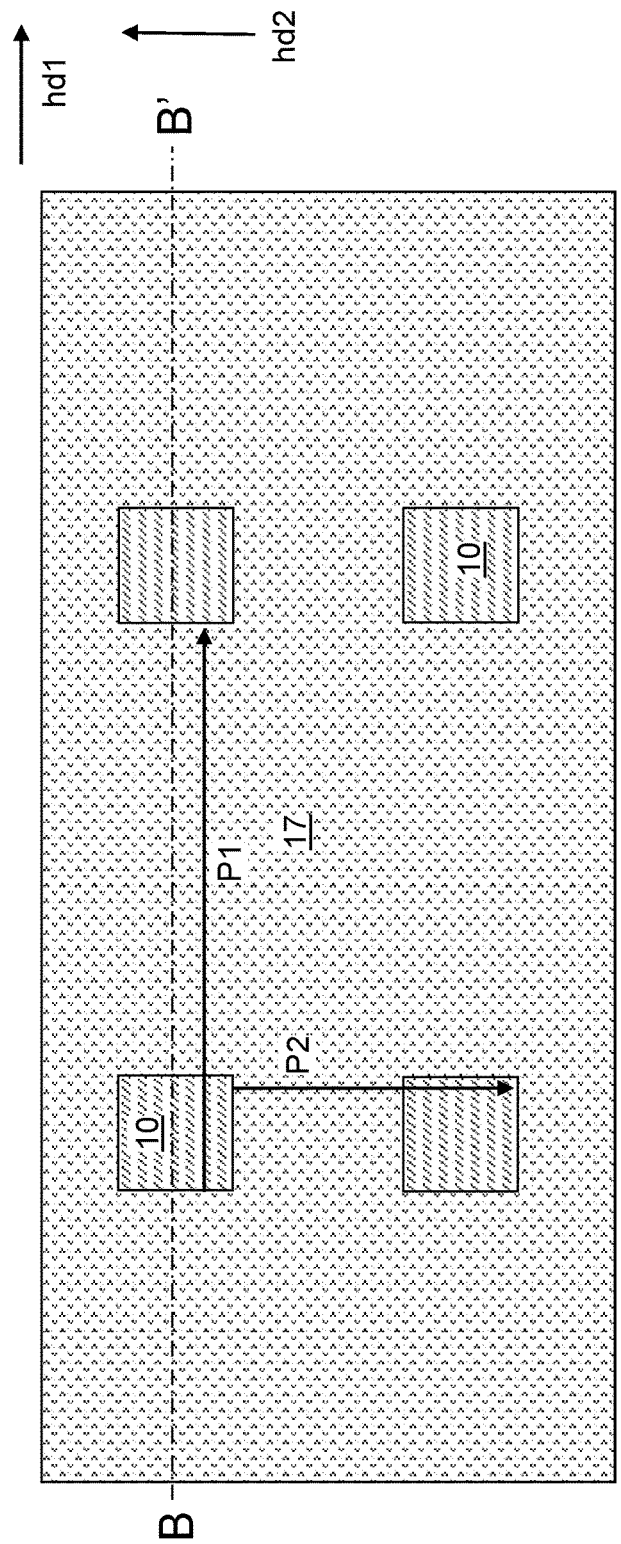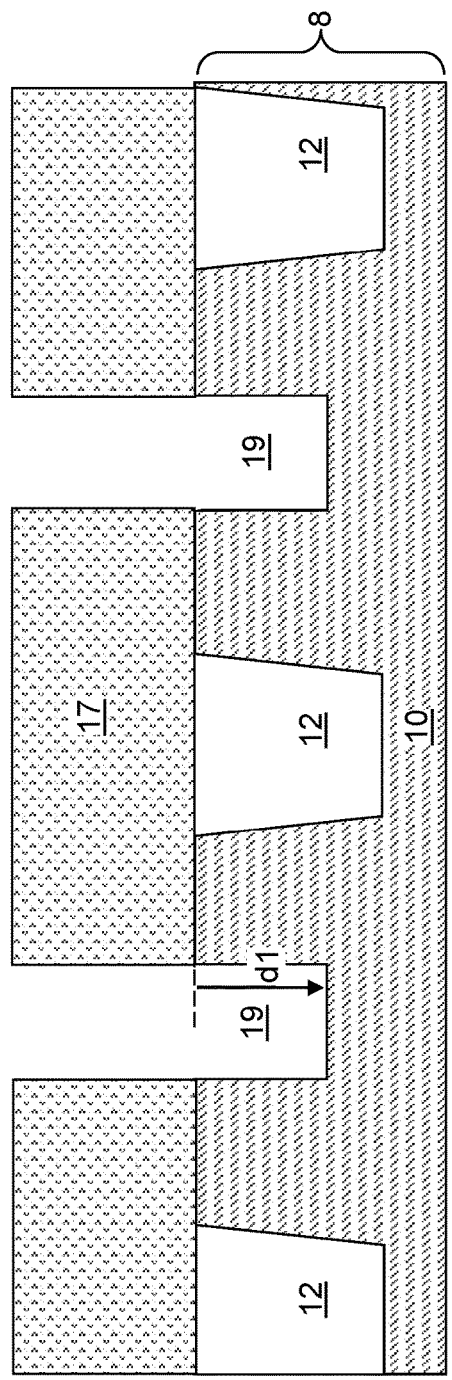

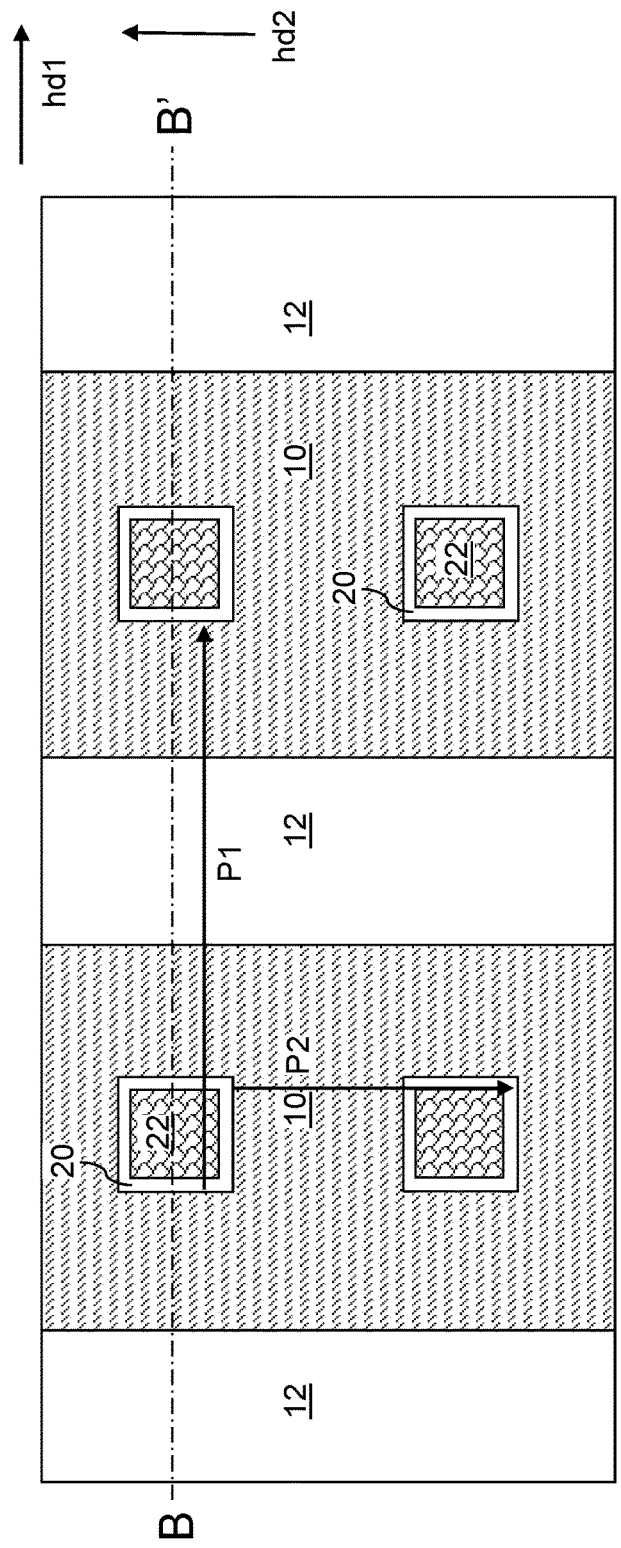
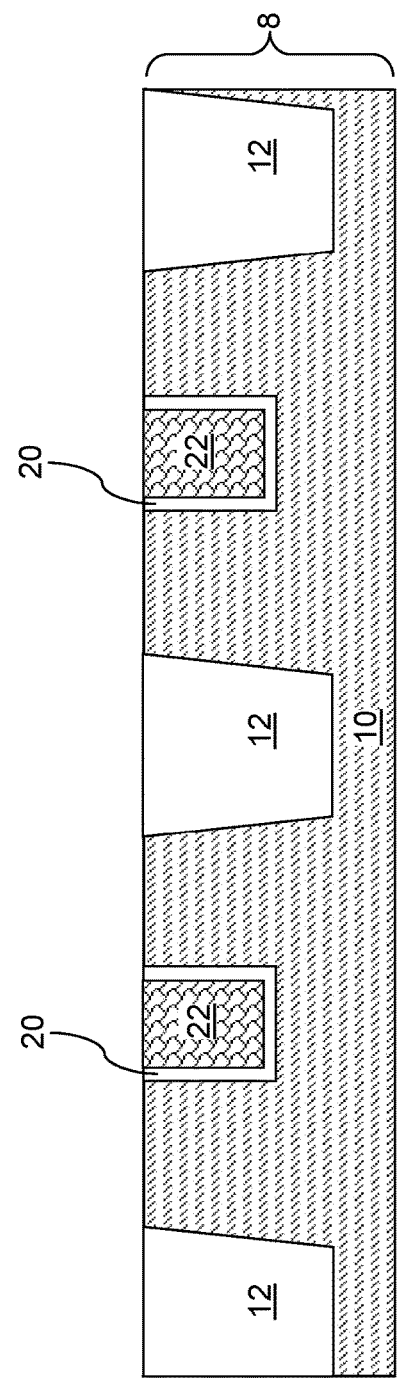
FIG. 4A
FIG. 4B

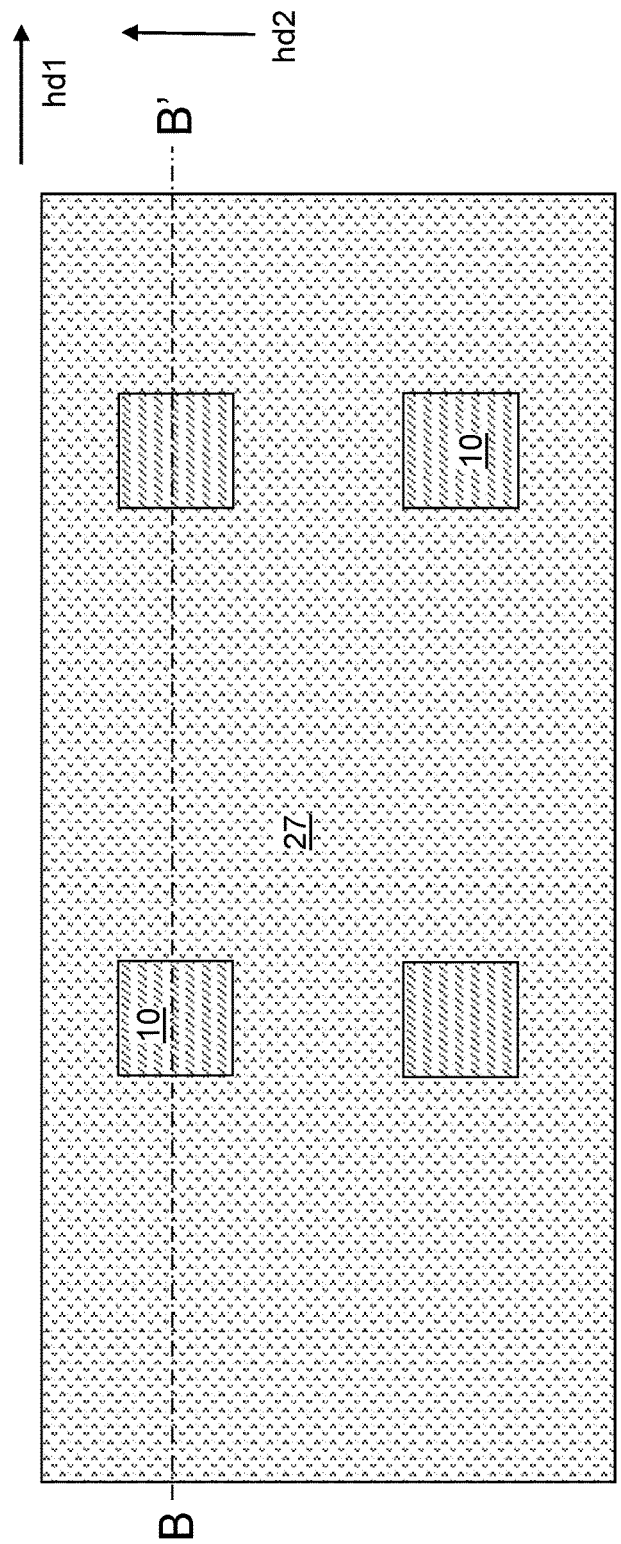
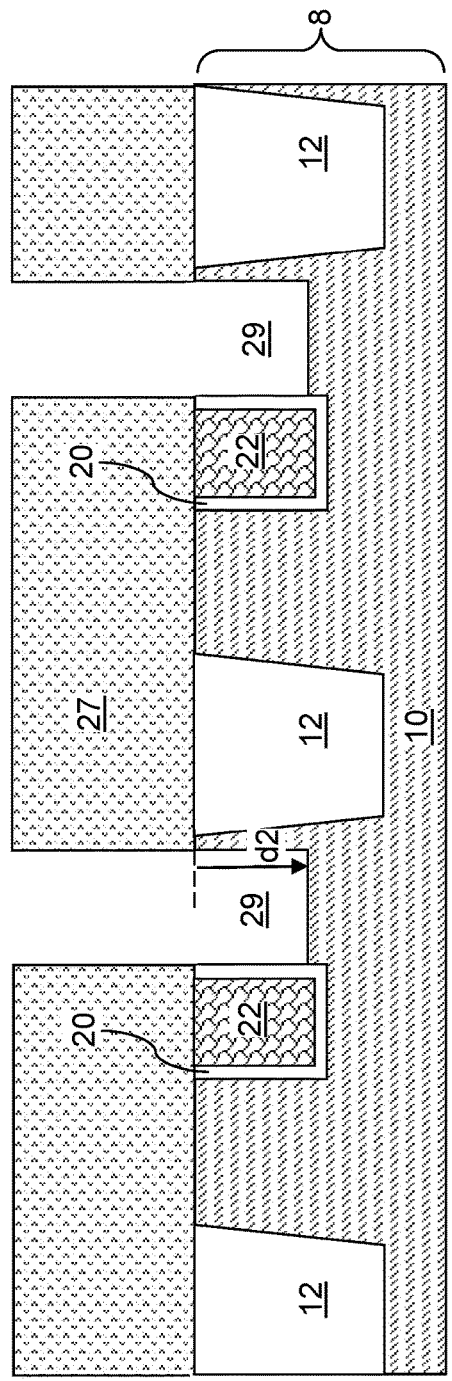
FIG. 5A
FIG. 5B

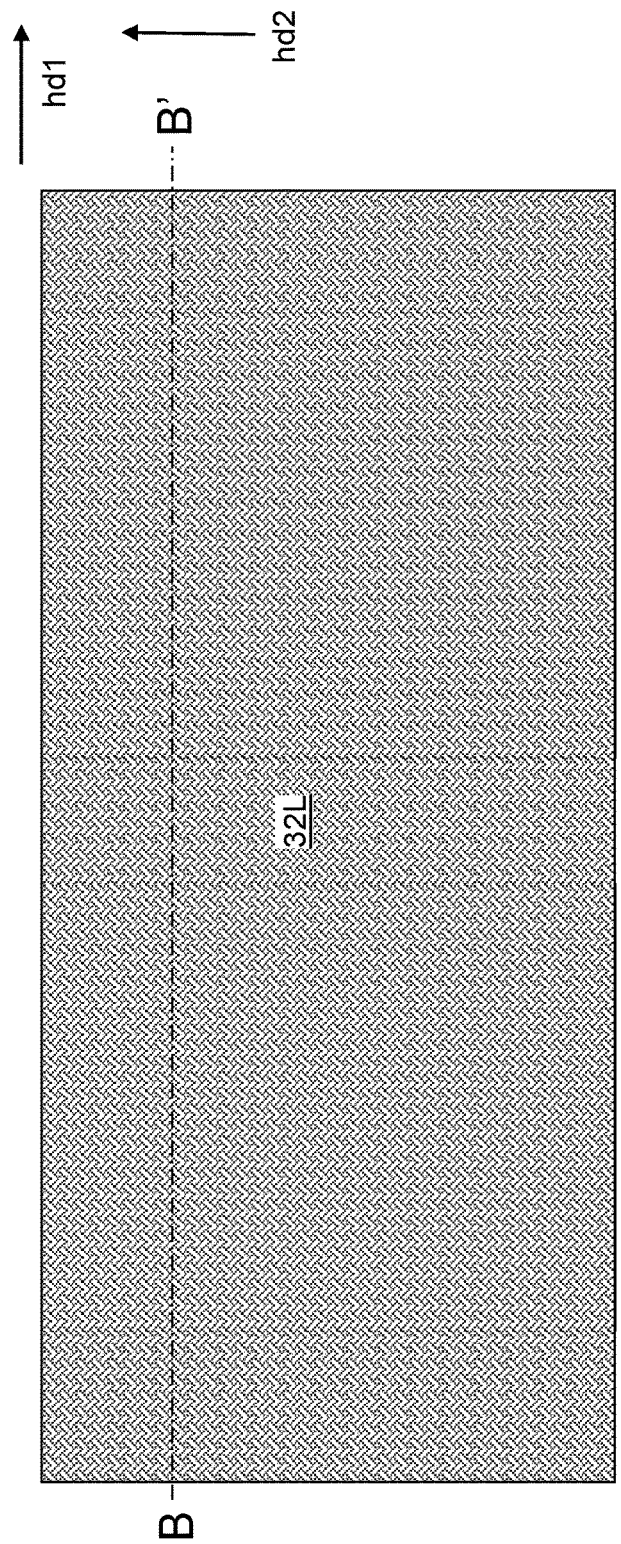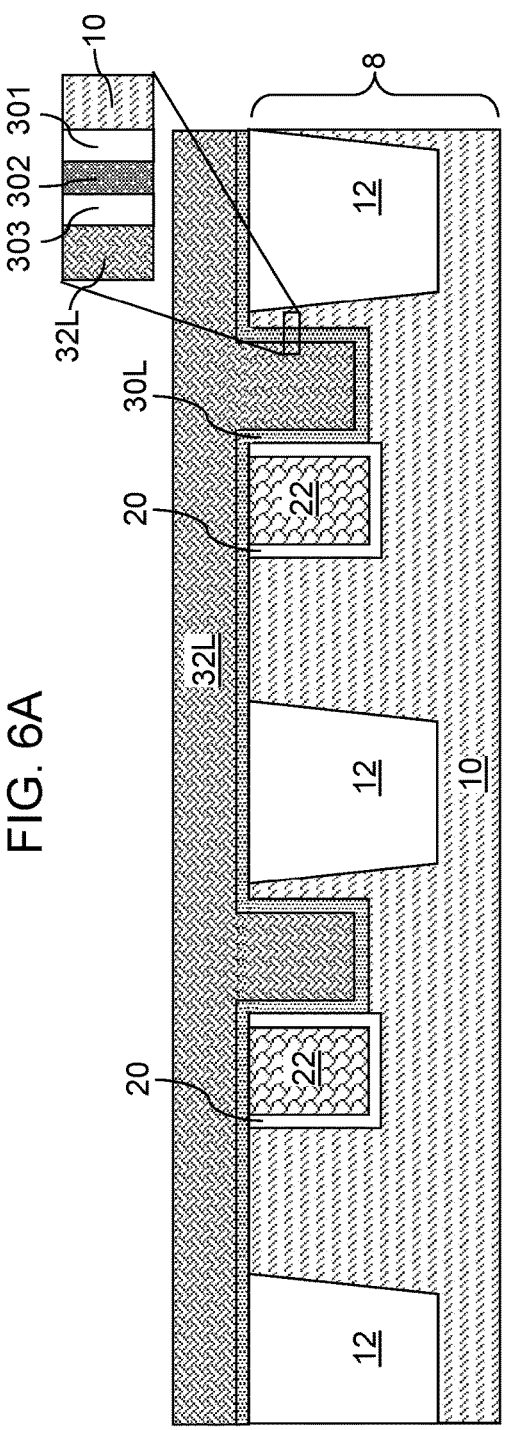

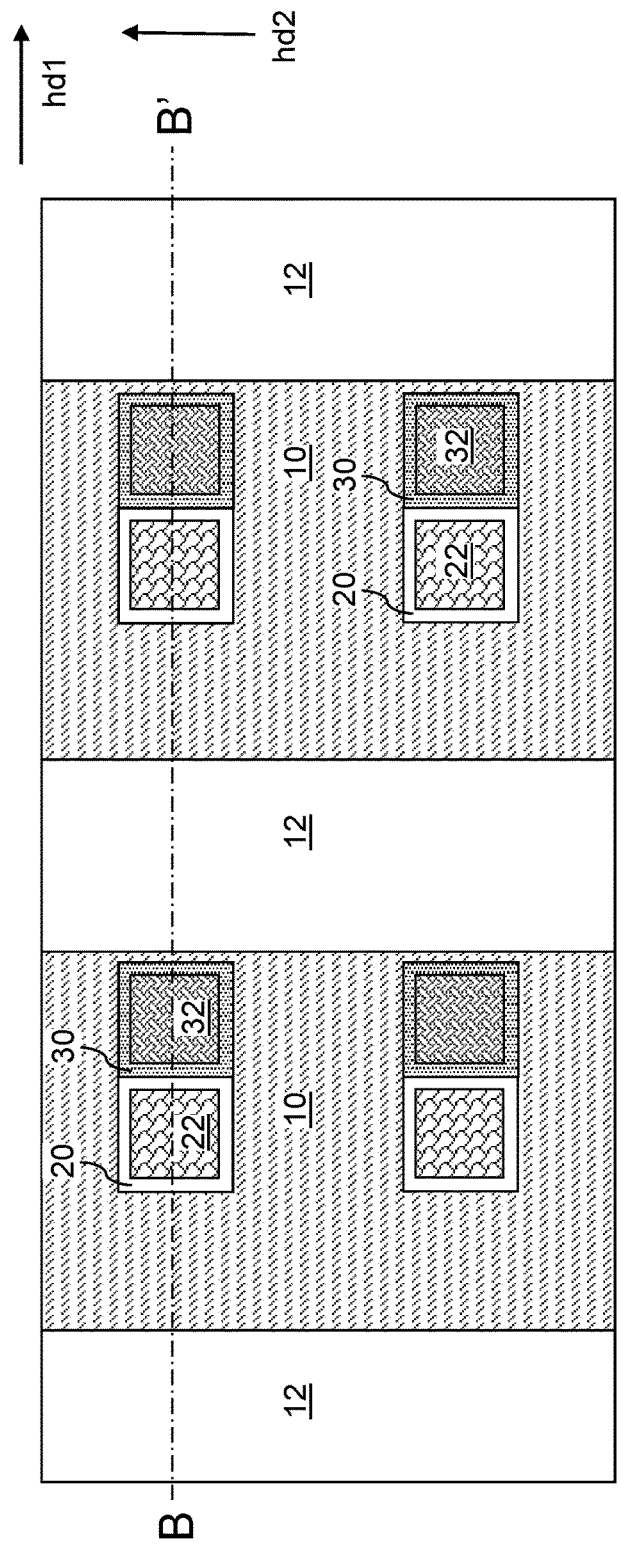
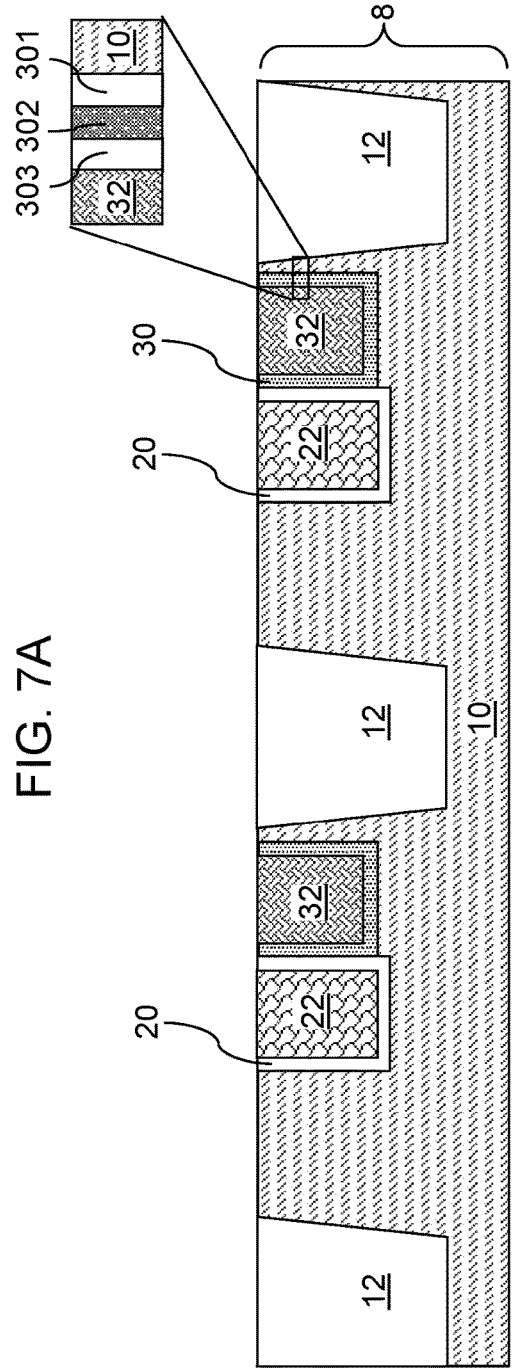
FIG. 7A
FIG. 7B

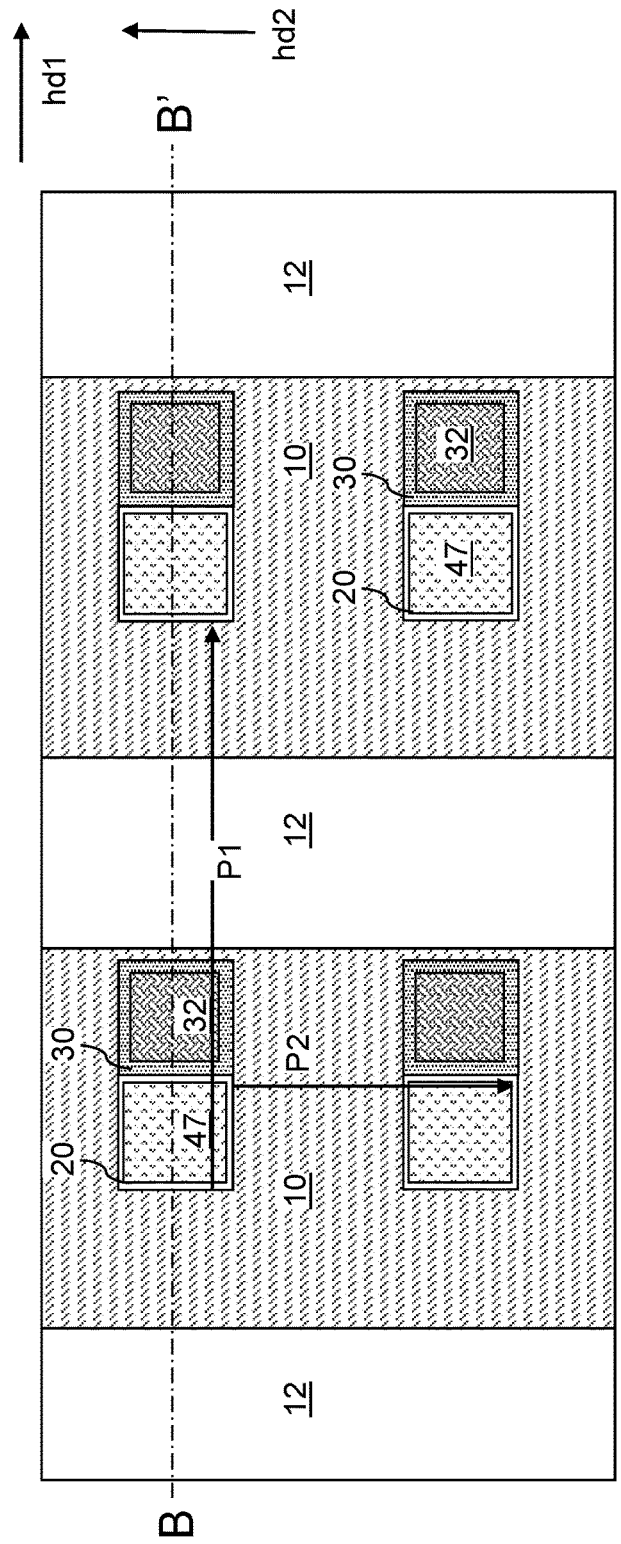
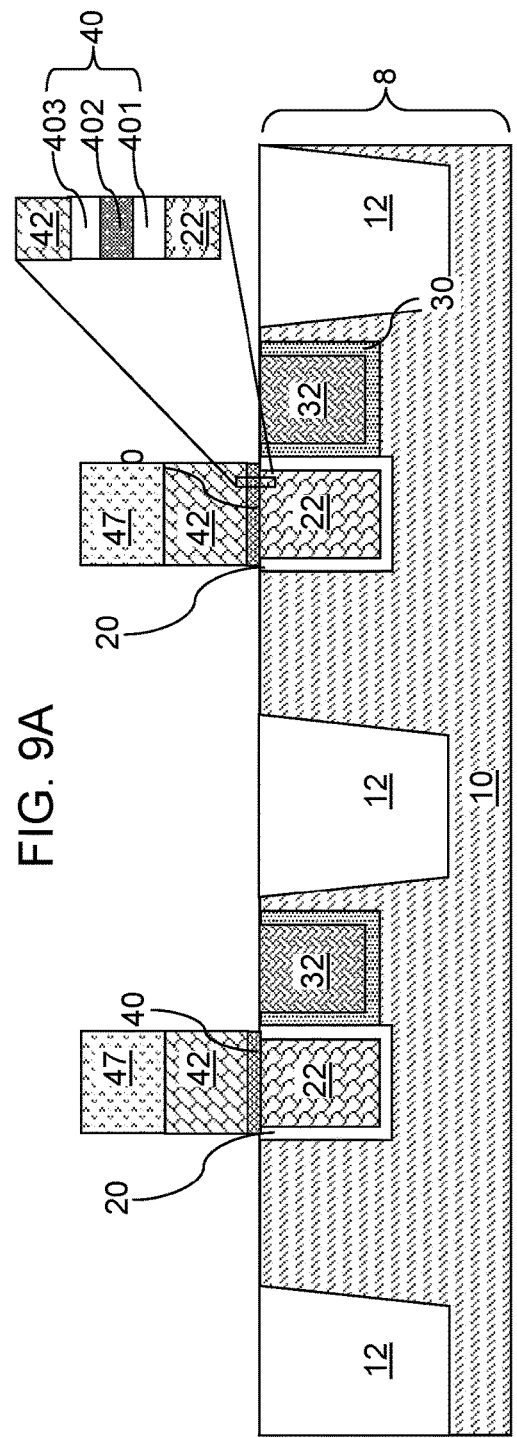
FIG. 9A
FIG. 9B

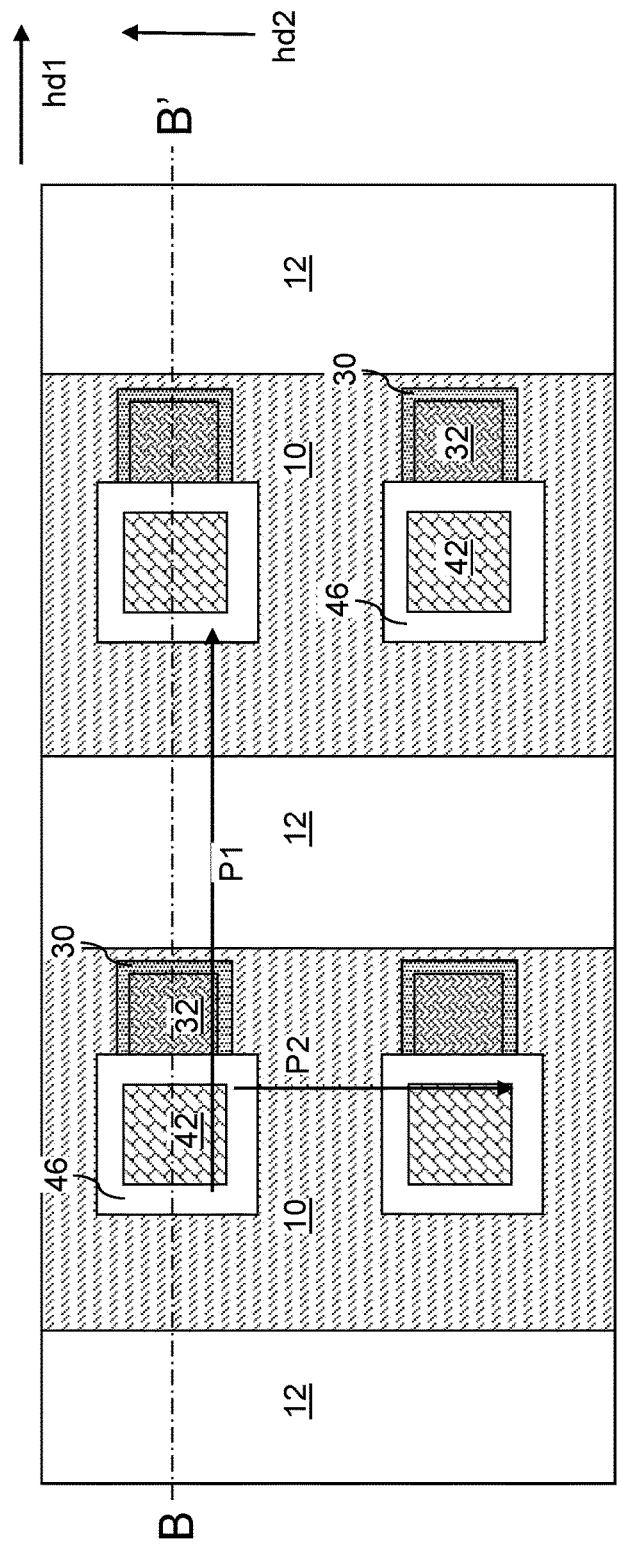
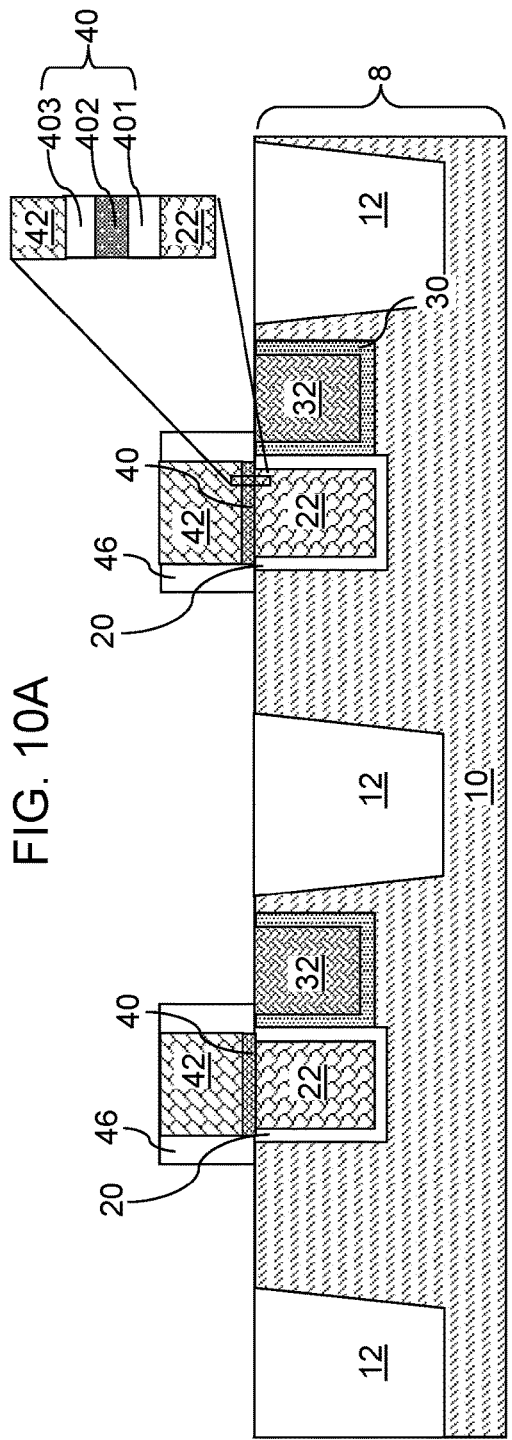
FIG. 10A
FIG. 10B

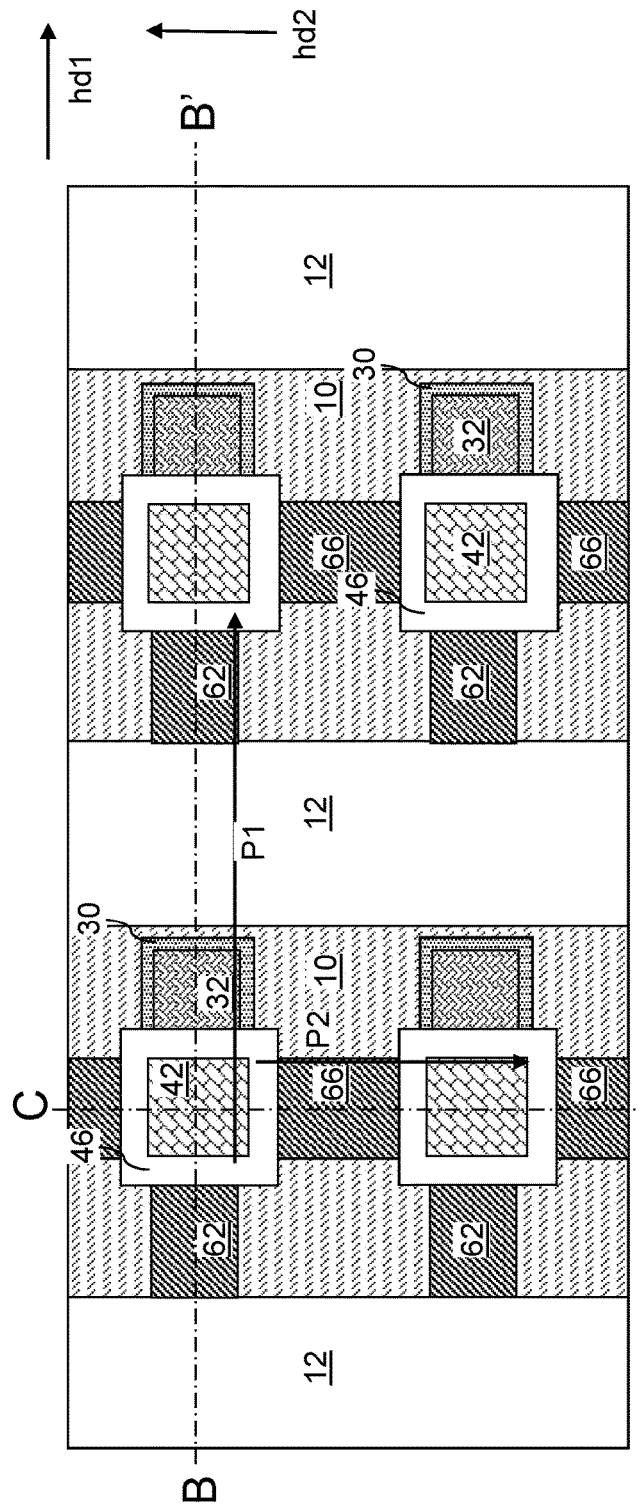
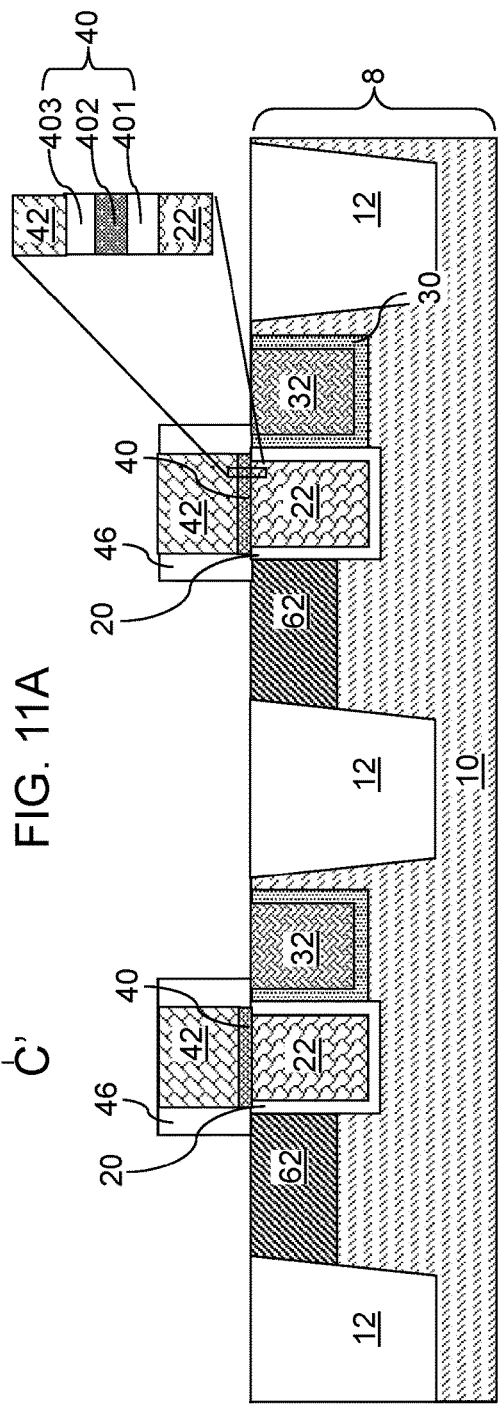
FIG. 11A
FIG. 11B

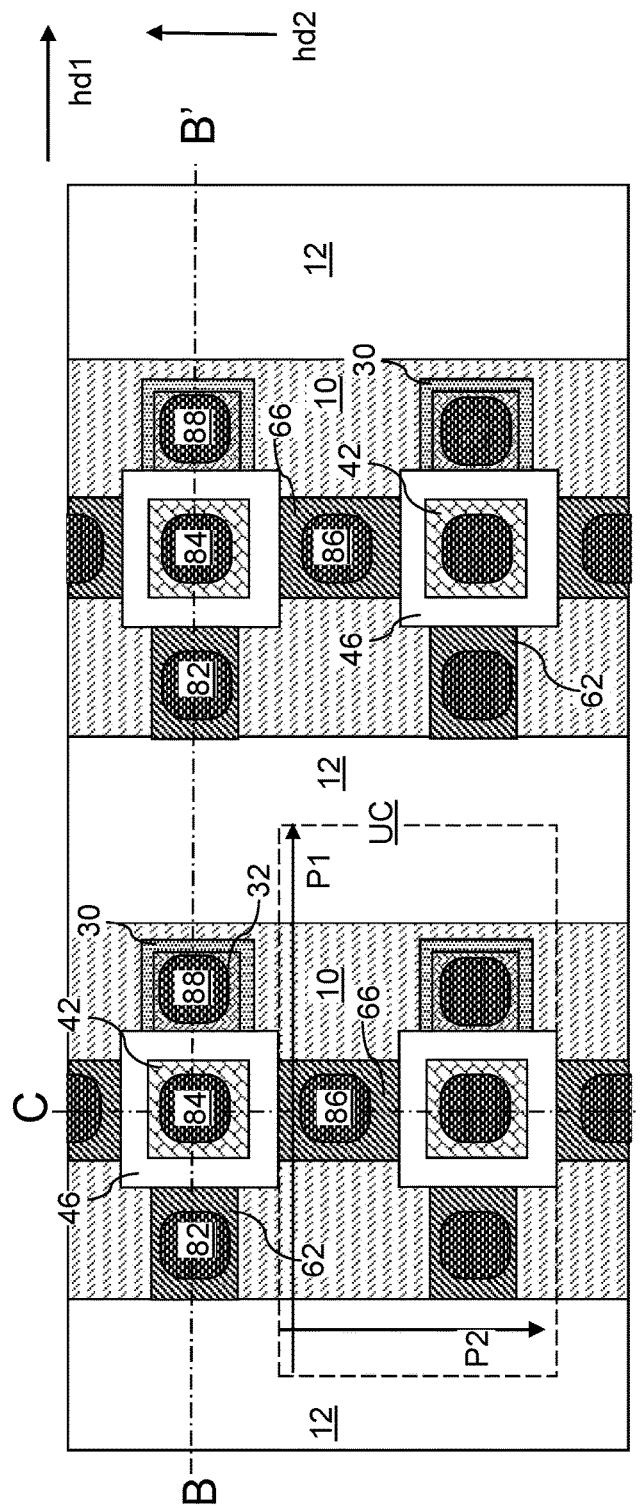
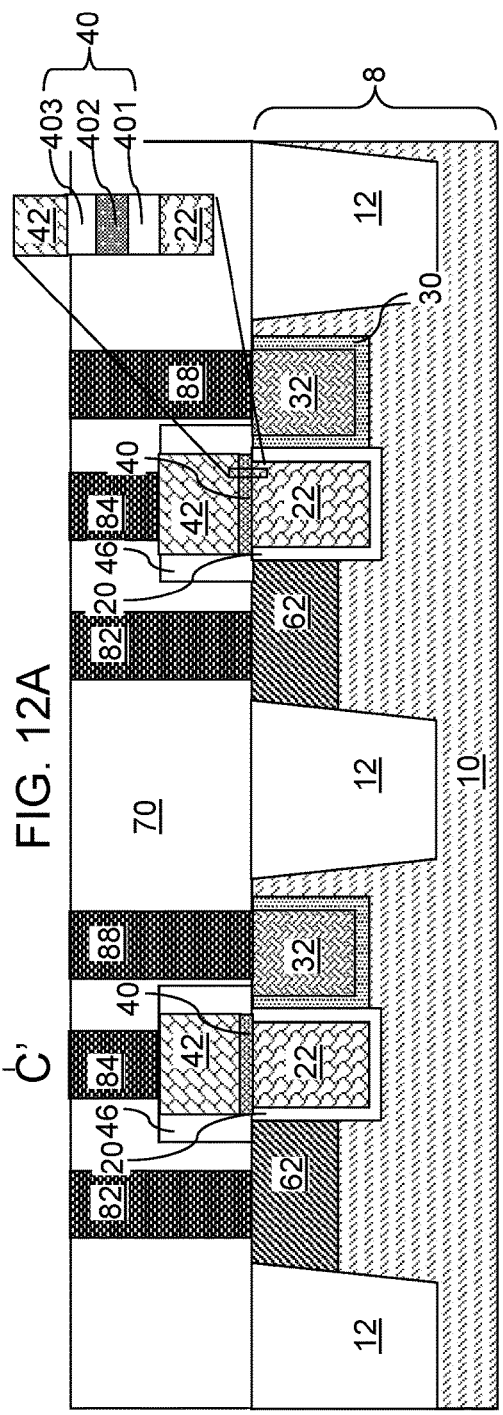
FIG. 12A
FIG. 12B

FLASH MEMORY DEVICE INCLUDING A BURIED FLOATING GATE AND A BURIED ERASE GATE AND METHODS OF FORMING THE SAME

RELATED APPLICATION

The instant application is a divisional application of U.S. application Ser. No. 16/852,654 filed on, Apr. 20, 2020, the entire contents of which are incorporated herein by reference.

BACKGROUND

A flash memory device stores electrical charges in a floating gate by inducing charge tunneling through a tunneling dielectric. Repeated charge tunneling through the tunneling dielectric over time may damage the tunneling dielectric. Consequently, the damaged tunneling dielectric may adversely impact the reliability of the flash memory device. Further, stacking of a floating gate and a control gate over a semiconductor channel may introduce significant topography to the flash memory device that may hinder subsequent patterning of overlying structures. An erase gate may reduce the damage to the tunneling gate. However, use of an erase gate requires greater precision in overlaying the erase gate relative to the floating gate. Methods and structures are desired for reducing the damage to the tunneling dielectric during operation of a flash memory device, and for reducing required precision in overlaying the gates during manufacture of the flash memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of an exemplary structure after formation of shallow trench isolation structures in a substrate semiconductor layer according to an embodiment of the present disclosure.

FIG. 1B is a vertical cross-sectional view of the exemplary structure along the plane B-B' of FIG. 1A.

FIG. 2A is a top-down view of the exemplary structure after formation of first openings in the substrate semiconductor layer according to an embodiment of the present disclosure.

FIG. 2B is a vertical cross-sectional view of the exemplary structure along the plane B-B' of FIG. 2A.

FIG. 4A is a top-down view of the exemplary structure after formation of tunneling dielectrics and floating gate electrodes according to an embodiment of the present disclosure.

FIG. 4B is a vertical cross-sectional view of the exemplary structure along the plane B-B' of FIG. 4A.

FIG. 5A is a top-down view of the exemplary structure after formation of second openings in the substrate semiconductor layer according to an embodiment of the present disclosure.

FIG. 5B is a vertical cross-sectional view of the exemplary structure along the plane B-B' of FIG. 5A.

FIG. 6A is a top-down view of the exemplary structure after formation of an erase gate dielectric layer and an erase gate electrode layer according to an embodiment of the present disclosure.

FIG. 6B is a vertical cross-sectional view of the exemplary structure along the plane B-B' of FIG. 6A.

FIG. 7A is a top-down view of the exemplary structure after formation of erase gate dielectrics and erase gate electrodes according to an embodiment of the present disclosure.

FIG. 7B is a vertical cross-sectional view of the exemplary structure along the plane B-B' of FIG. 7A.

FIG. 9A is a top-down view of the exemplary structure after formation of control gate electrodes and control gate dielectrics according to an embodiment of the present disclosure.

FIG. 9B is a vertical cross-sectional view of the exemplary structure along the plane B-B' of FIG. 9A.

FIG. 10A is a top-down view of the exemplary structure after formation of dielectric gate spacers according to an embodiment of the present disclosure.

FIG. 10B is a vertical cross-sectional view of the exemplary structure along the plane B-B' of FIG. 10A.

FIG. 11A is a top-down view of the exemplary structure after formation of active regions according to an embodiment of the present disclosure.

FIG. 11B is a vertical cross-sectional view of the exemplary structure along the plane B-B' of FIG. 11A.

FIG. 12A is a top-down view of the exemplary structure after formation of a planarization dielectric layer and various contact via structures according to an embodiment of the present disclosure.

FIG. 12B is a vertical cross-sectional view of the exemplary structure along the plane B-B' of FIG. 11A.

DETAILED DESCRIPTION

Figure 3A:
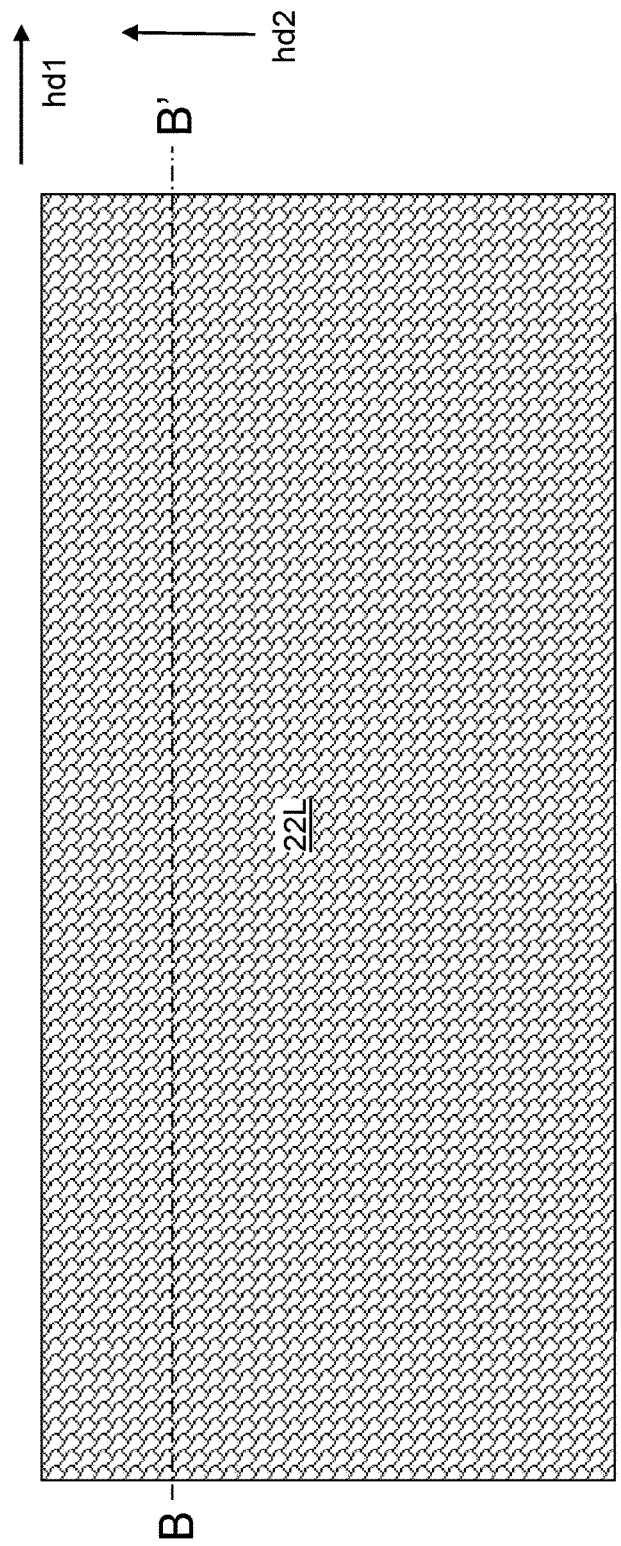
FIG. 3A is a top-down view of the exemplary structure after formation of a tunneling dielectric layer and a floating gate electrode layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to flash memory devices including a buried floating gate and a buried erase gate and method of forming the same.

Generally, the methods and structures of the present disclosure may be used to provide a flash memory device including a buried floating gate electrode and a buried erase gate electrode. Use of the buried erase gate electrode improves the lifespan of a tunneling dielectric. In addition, the buried configurations for the floating gate electrode and the erase gate electrode may reduce the topography of the flash memory device. Thus, the lithographic images utilized for the formation of the device may be provided with better focus during formation of a control gate electrode. The flash memory device may be formed in a two-dimensional array configuration. The various features and aspects of embodiments of the present disclosure are now described with reference to the drawings.

Referring to FIGS. 1A and 1B, an exemplary structure according to an embodiment of the present disclosure is illustrated, which includes a semiconductor substrate 8 that may comprise a substrate semiconductor layer 10. The semiconductor substrate 8 may be a bulk semiconductor substrate in which the substrate semiconductor layer 10 may extend from a front surface to a backside surface, or may be a semiconductor-on-insulator (SOI) substrate including a buried insulator layer (not shown) underlying the substrate semiconductor layer 10 and a handle substrate (not shown) that underlies the buried insulator layer. For example, the semiconductor substrate 8 may be a commercially available single crystalline bulk semiconductor substrate or a commercially available semiconductor-on-insulator substrate.

The substrate semiconductor layer 10 may include a single crystalline semiconductor material or a polycrystalline semiconductor material. In one embodiment, the entirety of the substrate semiconductor layer 10 may include a single crystalline semiconductor material such as single crystalline silicon. The semiconductor material of the substrate semiconductor layer 10 may have a doping of a first conductivity type, which may be p-type or n-type. The atomic concentration of dopants of the first conductivity type in the substrate semiconductor layer 10 may be in a range from $1.0 \times 10^{14}/cm^3$ to $3.0 \times 10^{17}/cm^3$, although lesser and greater atomic concentrations may also be used. In one embodiment, the substrate semiconductor layer 10 may consist essentially of silicon and dopants of the first conductivity type.

Shallow trench isolation structures 12 may be formed in an upper portion of the substrate semiconductor layer 10. For example, shallow trenches having a depth in a range from 50 nm to 500 nm may be formed through the top surface of the substrate semiconductor layer 10, although greater or lesser depths used. The shallow trenches may be formed by applying and patterning a photoresist layer over the top surface of the substrate semiconductor layer 10, and by transferring the pattern in the photoresist layer into the upper portion of the substrate semiconductor layer 10 using an anisotropic etch process. The photoresist layer may be subsequently removed, for example, by ashing. A dielectric material may be deposited in the shallow trenches, and excess portions of the dielectric may be removed from above the horizontal plane including the top surface of the substrate semiconductor layer 10 using a planarization process such as a chemical mechanical polishing (CMP) process. The remaining portions of the dielectric material that fill the shallow trenches comprise the shallow trench isolation structures 12. In one embodiment, the shallow trench isolation regions may define device regions that are laterally spaced apart along a first horizontal direction hd1. Each device region laterally extends along the first horizontal direction hd1 between a neighboring pair of shallow trench isolation structures 12. Each device region may have a uniform width along the first horizontal direction hd1, and may laterally extend along a second horizontal direction hd2 that is perpendicular to the first horizontal direction hd1. Each shallow trench isolation structure 12 may have a width in a range from 30 nm to 300 nm along the first horizontal direction hd1, although greater or lesser width may be used. The shallow trench isolation structures 12 may be arranged as a periodic one-dimensional array with a first pitch P1, i.e., a lateral distance at which a pattern is repeated, along the first horizontal direction hd1. While the present disclosure is described using portions of two device regions, it is understood that the exemplary structure may include multiple device regions and the illustrated structure may be repeated along the first horizontal direction hd1 and along the second horizontal direction hd2.

Referring to FIGS. 2A and 2B, a first photoresist layer 17 may be applied over the top surface of the semiconductor substrate 8. The first photoresist layer 17 may be lithographically patterned to form an array of openings therethrough. The openings in the first photoresist layer 17 may be located within the areas of the device regions located between neighboring pairs of shallow trench isolation structures 12. The pattern of the openings in the first photoresist layer 17 may be a two-dimensional periodic pattern which has the first pitch P1 along the first horizontal direction hd1 and has a second pitch P2 along a second horizontal direction hd2 that is perpendicular to the first horizontal direction. In such an embodiment, the pattern of the openings in the first photoresist layer 17 may be a rectangular two-dimensional periodic array.

An anisotropic etch process may be performed to transfer the pattern of the openings in the first photoresist layer 17 into the substrate semiconductor layer 10. First openings 19 may be formed in regions of the substrate semiconductor layer 10 that underlie the openings in the first photoresist layer 17. The first openings 19 formed in the substrate semiconductor layer 10 are also referred to as floating gate openings. The horizontal cross-sectional shape of each first opening 19 may be a shape of a rectangle, a rounded rectangle (a shape derived from a rectangle by rounding the four corners), a circle, an ellipse, or any other curvilinear two-dimensional shape with, or without, straight edges. In one embodiment, the horizontal cross-sectional shape of each first opening 19 may be substantially rectangular (as shown in FIGS. 2A and 2B). The lateral dimension of each first opening 19 along the first horizontal direction hd1 may be in a range from 20 nm to 200 nm, such as from 40 nm to 100 nm, although lesser and greater lateral dimensions may also be used. The lateral dimension of each first opening 19 along the second horizontal direction hd2 may be in a range from 20 nm to 200 nm, such as from 40 nm to 100 nm, although lesser and greater lateral dimensions may also be used. The bottom surface of each first opening 19 may be located at a first depth d1 from the horizontal plane including the top surface of the substrate semiconductor layer 10. The first depth d1 may be in a range from 200 nm to 200 nm, such as from 40 nm to 100 nm, although lesser and greater first depths may also be used. The first photoresist layer 17 may be subsequently removed, for example, by ashing.

Figure 3B:
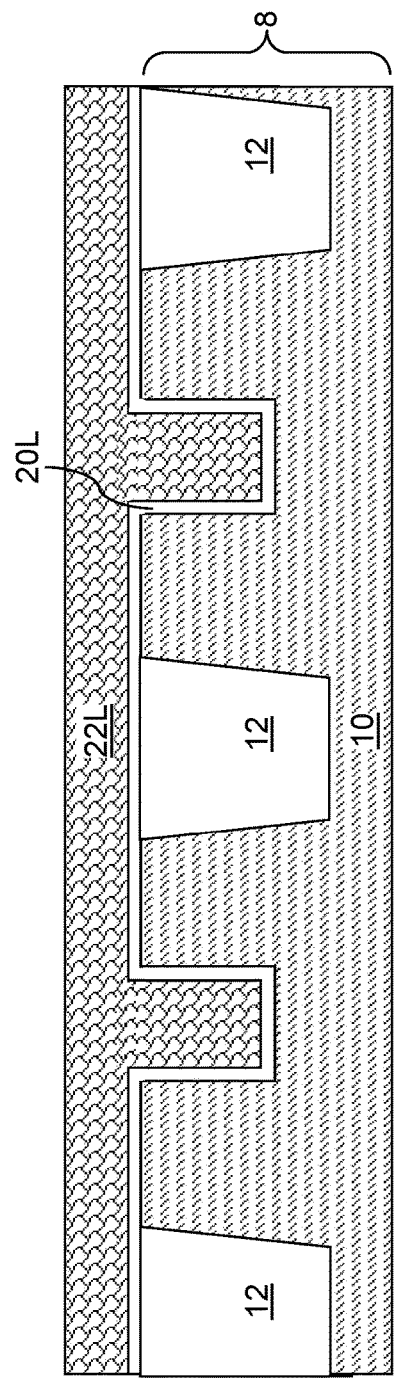
FIG. 3B is a vertical cross-sectional view of the exemplary structure along the plane B-B' of FIG. 3A.

Referring to FIGS. 3A and 3B, a tunneling dielectric layer 20L may be formed on the bottom surfaces and the sidewalls of the first openings 19 and over the top surface of the substrate semiconductor layer 10. The tunneling dielectric layer 20L includes a tunneling dielectric material, i.e., a dielectric material through which charge carriers (such as electrons or holes) may tunnel through. For example, the tunneling dielectric layer 20L may include thermal oxide formed by thermal oxidation of surface portions of the substrate semiconductor layer 10 that may be physically exposed to the first openings 19 or located at the top surface of the substrate semiconductor layer 10. The thickness of the tunneling dielectric layer 20L may be in a range from 2 nm to 6 nm, although lesser and greater thicknesses may also be used. In one embodiment, the horizontal portions and the vertical portions of the tunneling dielectric layer 20L may have the same thickness throughout.

A floating gate electrode layer 22L may be subsequently formed over the tunneling dielectric layer 20L. The floating gate electrode layer 22L includes a floating gate material, i.e., a material that may be used to form a floating gate electrode. For example, the floating gate electrode layer 22L may include a doped semiconductor material (such as p-doped polysilicon or n-doped polysilicon), a metallic nitride material (such as titanium nitride or tantalum nitride), and/or an elemental metal or an intermetallic alloy. Other suitable materials are within the contemplated scope of the disclosure. In an illustrative example, the floating gate electrode layer 22L includes doped polysilicon. The thickness of the floating gate electrode layer 22L may be selected such that remaining volumes of the first openings 19 are filled with the floating gate electrode layer 22L. The floating gate electrode layer 22L may be deposited by a conformal deposition process such as a chemical vapor deposition (CVD) process.

Referring to FIGS. 4A and 4B, a planarization process may be performed to remove portions of the floating gate electrode layer 22L and the tunneling dielectric layer 20L that are located above the horizontal plane including the top surface of the substrate semiconductor layer 10. The planarization process may use a chemical mechanical planarization (CMP) process and/or a recess etch process. In one embodiment, a chemical mechanical planarization process may be performed to planarize the floating gate electrode layer 22L and the tunneling dielectric layer 20L. Each remaining portion of the tunneling dielectric layer 20L located in a respective first opening 19 comprises a tunneling dielectric 20. Each remaining portion of the floating gate electrode layer 22L located in a respective first opening 19 comprises a floating gate electrode 22. A tunneling dielectric 20 and a floating gate electrode 22 may be formed in each first opening 19. The tunneling dielectrics 20 and the floating gate electrodes 22 may have top surfaces located within the horizontal plane including the top surface of the substrate semiconductor layer 10. Each floating gate electrode 22 may be formed within, and is laterally surrounded by, a respective tunneling dielectric 20.

Each floating gate electrode 22 may be formed within a respective first opening 19 that vertically extends from the top surface of the substrate semiconductor layer 10 toward a backside surface of the substrate semiconductor layer 10. Each tunneling dielectric 20 may be formed on sidewalls and a bottom surface of a respective first opening 19. A two-dimensional array of floating gate electrodes 22 may be formed within the substrate semiconductor layer 10 that has a doping of the first conductivity type. The two-dimensional array of floating gate electrodes 22 may be a periodic array having a first pitch P1 along the first horizontal direction hd1 and having the second pitch P2 along the second horizontal direction hd2. A two-dimensional array of tunneling dielectrics 20 may be formed within the substrate semiconductor layer 10. The two-dimensional array of tunneling dielectrics 20 may be a periodic array having a first pitch P1 along the first horizontal direction hd1 and having the second pitch P2 along the second horizontal direction hd2.

Referring to FIGS. 5A and 5B, a second photoresist layer 27 may be applied over the top surface of the semiconductor substrate 8. The second photoresist layer 27 may be lithographically patterned to form an array of openings therethrough. The openings in the second photoresist layer 27 may be located adjacent to the areas of the first openings 19 that include the tunneling dielectrics 20 and the floating gate electrodes 22. In one embodiment, the openings in the second photoresist layer 27 may be positioned such that each opening in the second photoresist layer 27 is laterally offset along the first horizontal direction hd1 from a respective one of the first openings 19. In one embodiment, a periphery of each opening in the second photoresist layer 27 may overlap with a periphery of a respective one of the first openings 19 in a plan view, i.e., a top-down view along a vertical direction that is perpendicular to the top surface of the semiconductor substrate 8. The pattern of the openings in the second photoresist layer 27 may be a two-dimensional periodic pattern which has the first pitch P1 along the first horizontal direction hd1 and has a second pitch P2 along a second horizontal direction hd2 that is perpendicular to the second horizontal direction. In such an embodiment, the pattern of the openings in the second photoresist layer 27 may be a rectangular two-dimensional periodic array. In one embodiment, each opening in the second photoresist layer 27 may have a sidewall that overlies, and contacts, a top surface of a respective one of the tunneling dielectrics 20.

An anisotropic etch process may be performed to transfer the pattern of the openings in the second photoresist layer 27 into the substrate semiconductor layer 10. Second openings 29 may be formed in regions of the substrate semiconductor layer 10 that underlie the openings in the second photoresist layer 27. The second openings 29 formed in the substrate semiconductor layer 10 are also referred to as erase gate openings. Each second opening 29 may be formed adjacent to a respective one of the first openings 19. In one embodiment, the chemistry of the anisotropic etch process may be selected such that the anisotropic etch process etches the semiconductor material of the substrate semiconductor layer 10 selective to the dielectric material of the tunneling dielectrics 20. Thus, an outer sidewall of each second opening 29 may coincide with an outer sidewall of a respective one of the tunneling dielectrics 20.

The horizontal cross-sectional shape of each second opening 29 may be a shape of a rectangle, a rounded rectangle (a shape derived from a rectangle by rounding the four corners), a circle, an ellipse, or any other curvilinear two-dimensional shape with, or without, straight edges. In one embodiment, the horizontal cross-sectional shape of each second opening 29 may be substantially rectangular. The lateral dimension of each second opening 29 along the second horizontal direction hd1 may be in a range from 20 nm to 200 nm, such as from 40 nm to 100 nm, although lesser and greater lateral dimensions may also be used. The lateral dimension of each second opening 29 along the second horizontal direction hd2 may be in a range from 20 nm to 200 nm, such as from 40 nm to 100 nm, although lesser and greater lateral dimensions may also be used. The bottom surface of each second opening 29 may be located at a second depth d2 from the horizontal plane including the top surface of the substrate semiconductor layer 10. The second depth d2 may be less than, greater than, or equal to, the first depth d1. The second depth d2 may be in a range from 200 nm to 200 nm, such as from 40 nm to 100 nm, although lesser and greater second depths may also be used. In one embodiment, the second depth d2 may be less than the first depth d1. The second photoresist layer 27 may be subsequently removed, for example, by ashing.

Referring to FIGS. 6A and 6B, an erase gate dielectric layer 30L may be formed on the bottom surfaces and the sidewalls of the second openings 29 and over the top surface of the substrate semiconductor layer 10. The erase gate dielectric layer 30L may include an erase gate dielectric material through which charge carriers (such as electrons or holes) may tunnel through. For example, the erase gate dielectric layer 30L may include an ONO stack, i.e., a stack of a first silicon oxide layer 301, a silicon nitride layer 302, and a second silicon oxide layer 303. The ONO stack may be formed, for example, by forming the first silicon oxide layer 301 by deposition of a silicon oxide material (for example, by thermal decomposition of tetraethylorthosilicate glass) or by thermal conversion of physically exposed surface portions of the substrate semiconductor layer 10, by depositing a silicon nitride layer 302, and by converting a surface portion of the silicon nitride layer into the second silicon oxide layer 303 by a thermal oxidation process. The thickness of the erase gate dielectric layer 30L may be in a range from 2 nm to 6 nm, although lesser and greater thicknesses may also be used. In one embodiment, the horizontal portions and the vertical portions of the erase gate dielectric layer 30L may have the same thickness throughout.

An erase gate electrode layer 32L may be subsequently formed on the erase gate dielectric layer 30L. The erase gate electrode layer 32L includes a gate electrode material. For example, the erase gate electrode layer 32L may include a doped semiconductor material (such as p-doped polysilicon or n-doped polysilicon), a metallic nitride material (such as titanium nitride or tantalum nitride), and/or an elemental metal or an intermetallic alloy. Other suitable materials are within the contemplated scope of disclosure. In an illustrative example, the erase gate electrode layer 32L includes doped polysilicon. The thickness of the erase gate electrode layer 32L may be selected such that remaining volumes of the second openings 29 may be filled with the erase gate electrode layer 32L. The erase gate electrode layer 32L may be deposited by a conformal deposition process such as a chemical vapor deposition (CVD) process.

Referring to FIGS. 7A and 7B, a planarization process may be performed to remove portions of the erase gate electrode layer 32L and the erase gate dielectric layer 30L that are located above the horizontal plane including the top surface of the substrate semiconductor layer 10. The planarization process may use a chemical mechanical planarization (CMP) process and/or a recess etch process. In one embodiment, a chemical mechanical planarization process may be performed to planarize the erase gate electrode layer 32L and the erase gate dielectric layer 30L. Each remaining portion of the erase gate dielectric layer 30L located in a respective second opening 29 comprises an erase gate dielectric 30. Each remaining portion of the erase gate electrode layer 32L located in a respective second opening 29 comprises an erase gate electrode 32. An erase gate dielectric 30 and an erase gate electrode 32 may be formed in each second opening 29. The erase gate dielectrics 30 and the erase gate electrodes 32 may have top surfaces located within the horizontal plane including the top surface of the substrate semiconductor layer 10. Each erase gate electrode 32 may be formed within, and may be laterally surrounded by, a respective erase gate dielectric 30.

Each erase gate electrode 32 may be formed within a respective second opening 29 that vertically extends from the top surface of the substrate semiconductor layer 10 toward a backside surface of the substrate semiconductor layer 10. Each erase gate dielectric 30 may be formed on sidewalls and a bottom surface of a respective second opening 29. A two-dimensional array of erase gate electrodes 32 may be formed within the substrate semiconductor layer 10 that has a doping of the first conductivity type. The two-dimensional array of erase gate electrodes 32 may be a periodic array having a first pitch P1 along the first horizontal direction hd1 and having the second pitch P2 along the second horizontal direction hd2. A two-dimensional array of erase gate dielectrics 30 may be formed within the substrate semiconductor layer 10. The two-dimensional array of erase gate dielectrics 30 may be a periodic array having a first pitch P1 along the first horizontal direction hd1 and having the second pitch P2 along the second horizontal direction hd2.

The floating gate electrodes 22 and the erase gate electrodes 32 may be formed within the substrate semiconductor layer 10. In one embodiment, each erase gate electrode 32 may be laterally spaced apart from the most proximal floating gate electrode 22 along the first horizontal direction hd1. In one embodiment, each erase gate electrode 32 may be formed at a location that is laterally spaced apart, i.e., laterally offset, from a most proximal floating gate electrode 22 along the first horizontal direction hd1. In one embodiment, each erase gate electrode 32 may be laterally spaced from the most proximal floating gate electrode 22 by a vertical portion of a tunneling dielectric 20 and a vertical portion of an erase gate dielectric 30. In such an embodiment, the lateral spacing between each erase gate electrode 32 and the most proximal floating gate electrode 22 may be the sum of the thickness of the tunneling dielectric 20 and the thickness of the erase gate dielectric 30. A two-dimensional array of erase gate electrodes 32 may be formed within the substrate semiconductor layer 10, and may be laterally offset from the two-dimensional array of floating gate electrodes 22 along the first horizontal direction hd1. The offset direction between each neighboring pair of an erase gate electrode 32 and a floating gate electrode 22 is herein referred to as an axial direction. Each adjoined set of a tunneling dielectric 20, a floating gate electrode 22, an erase gate dielectric 30, and an erase gate electrode 32 may have mirror symmetry about a vertical plane that horizontally extends along the axial direction. In the illustrated example, the axial direction may be the first horizontal direction hd1.

Figure 8A:
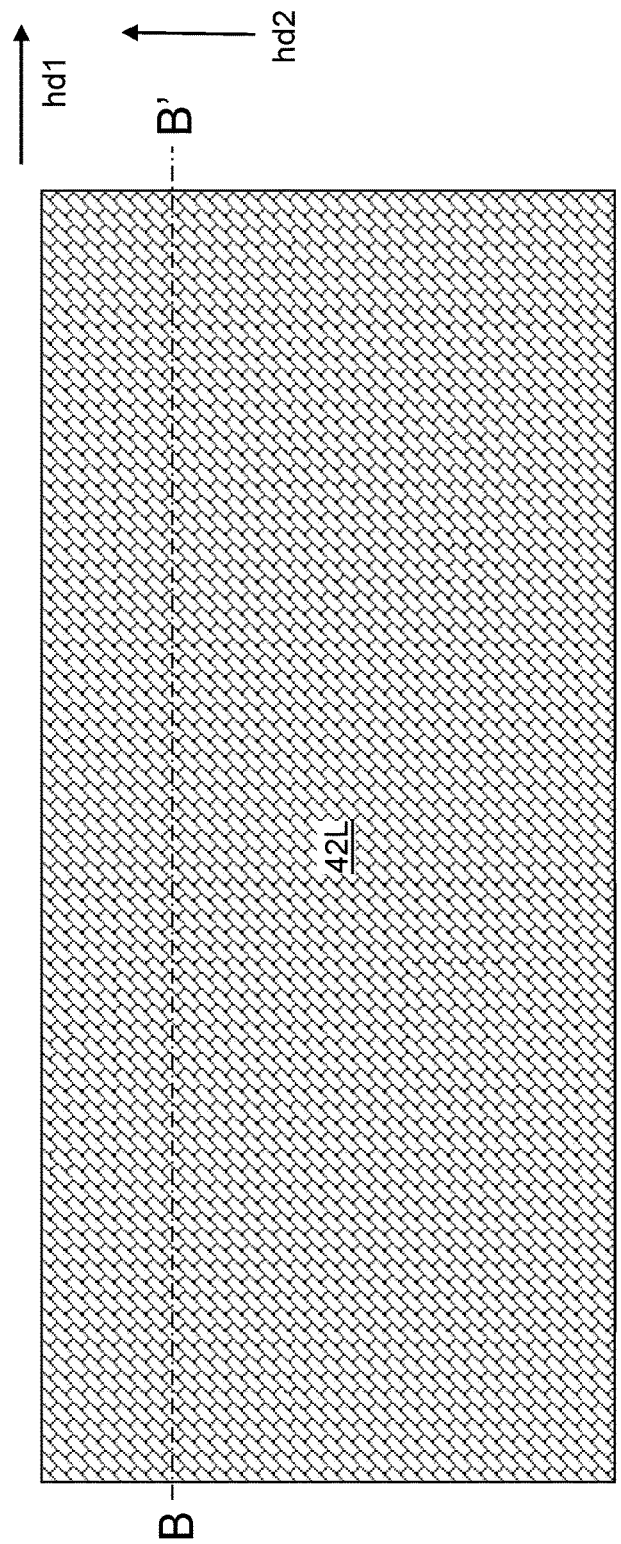
FIG. 8A is a top-down view of the exemplary structure after formation of a control gate dielectric layer and a control gate electrode layer according to an embodiment of the present disclosure.
Figure 8B:
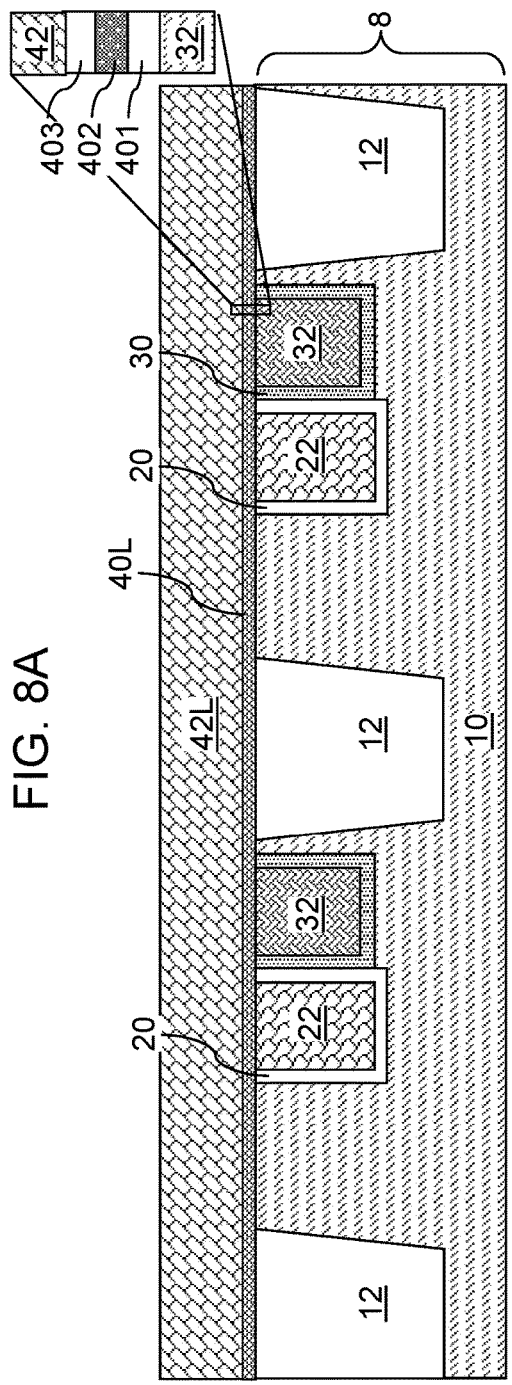
FIG. 8B is a vertical cross-sectional view of the exemplary structure along the plane B-B' of FIG. 8A.

Referring to FIGS. 8A and 8B, a control gate dielectric layer 40L may be deposited over the top surface of the substrate semiconductor layer 10. The control gate dielectric layer 40L may be deposited directly on the top surfaces of the tunneling dielectrics 20, the floating gate electrodes 22, the erase gate dielectrics 30, and the erase gate electrodes 32. In one embodiment, top surfaces of the tunneling dielectrics 20, the floating gate electrodes 22, the erase gate dielectrics 30, and the erase gate electrodes 32 may be coplanar with the top surface of the substrate semiconductor layer 10. The control gate dielectric layer 40L includes a control gate dielectric material that is thick enough to prevent tunneling of charge carriers during operation. For example, the control gate dielectric layer 40L may include an ONO stack, i.e., a stack of a first silicon oxide layer 401, a silicon nitride layer 402, and a second silicon oxide layer 403. The ONO stack may be formed, for example, by forming the first silicon oxide layer 401 by deposition of a silicon oxide material (for example, by thermal decomposition of tetraethylorthosilicate glass) or by thermal conversion of physically exposed surface portions of the substrate semiconductor layer 10, the floating gate electrodes 22, and the erase gate electrodes 32, by depositing a silicon nitride layer 402, and by converting a surface portion of the silicon nitride layer into the second silicon oxide layer 403 by a thermal oxidation process. The thickness of the control gate dielectric layer 40L may be in a range from 3 nm to 12 nm, although lesser and greater thicknesses may also be used. The control gate dielectric layer 40L may be formed as a planar material layer having a uniform thickness throughout.

A control gate electrode layer 42L may be subsequently formed on the control gate dielectric layer 40L. The control gate electrode layer 42L includes a gate electrode material. For example, the control gate electrode layer 42L may include a doped semiconductor material (such as p-doped polysilicon or n-doped polysilicon), a metallic nitride material (such as titanium nitride or tantalum nitride), and/or an elemental metal or an intermetallic alloy. Other suitable materials are within the contemplated scope of disclosure. In an illustrative example, the control gate electrode layer 42L includes doped polysilicon. The thickness of the control gate electrode layer 42L may be in a range from 50 nm to 300 nm, such as from 100 nm to 200 nm, although lesser and greater thicknesses may also be used. The control gate electrode layer 42L may be deposited by a conformal deposition process such as a chemical vapor deposition (CVD) process, or may be deposited by a non-conformal deposition process such as physical vapor deposition (PVD), i.e., sputtering.

Referring to FIGS. 9A and 9B, a third photoresist layer 47 may be applied over the control gate electrode layer 42L, and may be lithographically patterned to form a patterned photoresist layer including discrete photoresist material portions. The patterned portions of the photoresist material portions of the third photoresist layer 47 may be formed as in areas that overlap with the areas of the two-dimensional array of floating gate electrodes 22. In one embodiment, each of the floating gate electrodes 22 may be completely covered with lithographically patterned portions of the third photoresist layer 47. In one embodiment, sidewalls of the discrete patterned portions of the third photoresist layer 47 may be formed within the areas of the top surfaces of the tunneling dielectrics 20. In one embodiment, the discrete patterned portions of the third photoresist layer 47 may be formed as a periodic two-dimensional array of photoresist material portions having the first pitch P1 along the first horizontal direction hd1 and the second pitch P2 along the second horizontal direction hd2.

The control gate dielectric layer 40L and the control gate electrode layer 42L are formed on a planar surface with no, or minimal, topographical variations. The lithographic patterning process that patterns the third photoresist layer 47 may form a lithographic image with a focal plane located within the third photoresist layer 47. Since the third photoresist layer 47 does not have any topographical variations at the time of image formation, the third photoresist layer 47 may be patterned with high pattern fidelity.

An anisotropic etch process such as a reactive ion etch process may be performed to transfer the pattern in the third photoresist layer 47 through the control gate electrode layer 42L and the control gate dielectric layer 40L. The control gate electrode layer 42L and the control gate dielectric layer 40L may be anisotropically etched using the patterned third photoresist layer 47 as an etch mask. Patterned portion of the control gate electrode layer 42L comprise the control gate electrodes 42, and patterned portions of the control gate dielectric layer 40L comprise control gate dielectrics 40. A vertical stack of a control gate dielectric 40 and a control gate electrode 42 may be formed over each floating gate electrode 22. Each control gate dielectric 40 may be located directly on a top surface of an underlying floating gate electrode 22. Thus, the control gate dielectric 40 may contact the entirety of the top surface of the underlying floating gate electrode 22, and may contact an inner periphery of the top surface of the underlying tunneling dielectric 20. Each control gate electrode 42 overlies a respective underlying floating gate electrode 22, and is vertically spaced from the respective underlying floating gate electrode 22 by a control gate dielectric 40. Each tunneling dielectric 20 laterally surrounding a respective floating gate electrode 22, and contacts a bottom surface of a respective control gate dielectric 40. A two-dimensional array of control gate electrodes 42 may be formed, which may be a periodic two-dimensional array having the first pitch P1 along the first horizontal direction hd2 and having the second pitch P2 along the second horizontal direction hd2. The third photoresist layer 47 may be subsequently removed, for example, by ashing.

Referring to FIGS. 10A and 10B, a dielectric spacer material layer may be conformally deposited on the physically exposed surfaces of the control gate electrodes 42, the control gate dielectrics 40, and the various structures formed in the semiconductor substrate 8. The dielectric spacer material layer includes a dielectric material such as silicon oxide or silicon nitride. Other suitable materials are within the contemplated scope of disclosure. The conformal deposition of the dielectric spacer material layer may be effected, for example, by a chemical vapor deposition process such as a low pressure chemical vapor deposition (LPCVD) process. The thickness of the dielectric spacer material layer may be in a range from 5 nm to 80 nm, such as from 10 nm to 40 nm, although lesser and greater thicknesses may also be used. The thickness of the dielectric spacer material layer is less than the lateral dimension of each erase gate dielectric 30 along the first horizontal direction hd1 so that a top surface of each erase gate electrode 32 may be physically exposed after formation of dielectric gate spacers.

An anisotropic etch process may be performed to remove horizontally-extending portions of the dielectric spacer material layer. The horizontally-extending portions of the dielectric spacer material layer are removed from above the top surfaces of the control gate electrodes 42, and from above portions of the top surface of the semiconductor substrate 8 that are laterally spaced from the control gate electrodes 42 by a spacing greater than the thickness of the dielectric spacer material layer. Vertically-extending portions of the dielectric spacer material layer that laterally surround a respective one of the control gate electrodes 42 constitute dielectric gate spacers 46. Each dielectric gate spacer 46 may have a generally tubular configuration, and thus, may be topologically homeomorphic to a torus. The lateral thickness of each dielectric gate spacer 46 may be the same as the thickness of the dielectric spacer material layer, and thus, may be in a range from 5 nm to 80 nm, such as from 10 nm to 40 nm, although lesser and greater thicknesses may also be used. Top surfaces of the erase gate electrodes 32 and the erase gate dielectrics 30 may be physically exposed after formation of the dielectric gate spacers 46. Each dielectric gate spacer 46 contacts a top surface of a vertical segment of an erase gate dielectric 30. In one embodiment, each dielectric gate spacer 46 may contact at least a portion, and/or all of, the outer periphery of a top surface of an underlying tunneling dielectric 20. In one embodiment, each dielectric gate spacer 46 may contact all sidewalls of a respective floating gate electrode 22 and a top surface of a respective underlying tunneling dielectric 20, which may be formed in the substrate semiconductor layer 10 and laterally surrounds a floating gate electrode 22.

Figure 11C:
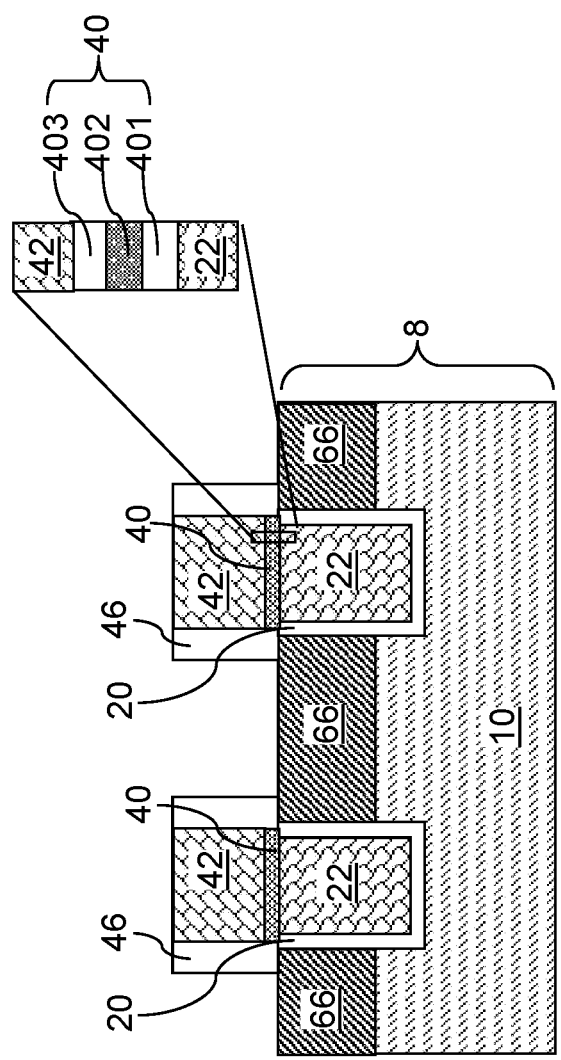
FIG. 11C is a vertical cross-sectional view of the exemplary structure along the plane C-C' of FIG. 11A.
Figure 11D:
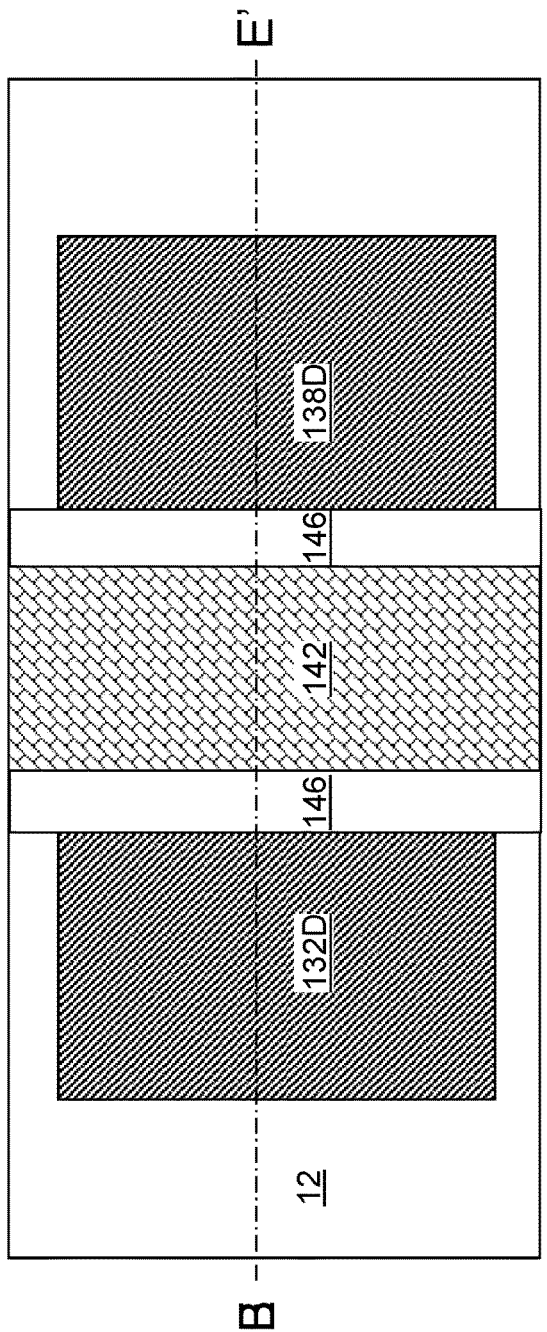
FIG. 11D is a top-down view of a logic region of the exemplary structure at the processing steps of FIGS. 11A-11D.
Figure 11E:
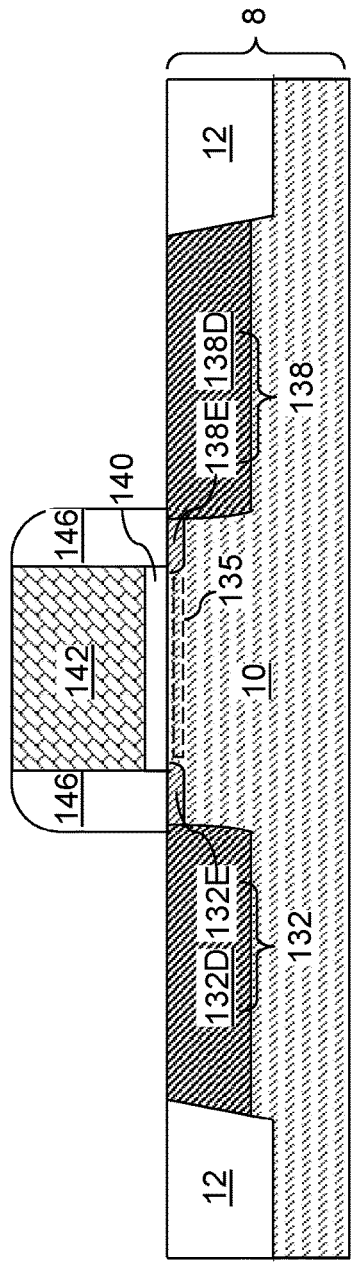
FIG. 11E is a vertical cross-sectional view of the exemplary structure along the plane E-E' of FIG. 11D.

Referring to FIGS. 11A-11E, various active regions (62, 66, 132, 138) may be formed in various regions of the exemplary structure by performing at least one masked ion implantation process. FIGS. 11A-11C illustrate a memory region in which a two-dimensional array of flash memory cells is formed. FIGS. 11D and 11E illustrate a logic region in which logic devices, such as field effect transistors of a control circuit that controls the operation of the flash memory cells, are formed. A logic gate dielectric layer may be formed in the logic region in lieu of the control gate dielectric layer 40L at the processing steps of FIGS. 8A and 8B, for example, by removal of the silicon nitride layer 402 and the first silicon oxide layer 401 from the logic region prior to formation of the second silicon oxide layer 403. A silicon oxide layer may be formed in the logic region on the top surface of the substrate semiconductor layer 10 concurrently with formation of the second silicon oxide layer 403. The control gate electrode layer 42L may be formed in the logic region concurrently with formation of the control gate electrode layer 42L in the memory array region. The control gate electrode layer 42L and the silicon oxide layer in the logic region may be patterned to form gate stacks, each of which may include a gate dielectric 140 and a gate electrode 142. Gate spacers 146 may be formed around each gate stack (140, 142) concurrently with formation of the dielectric gate spacers 46.

Electrical dopants (such as p-type dopants or n-type dopants) may be implanted into unmasked portions of the substrate semiconductor layer 10 in the logic region prior to, and/or after, formation of the gate spacers 146 to form source regions 132 and drain regions 138. Each source region 132 may include a source extension region 132E and a deep source region 132D, and each drain region 138 may include a drain extension region 138E and a deep drain region 138D. Each surface portion of the substrate semiconductor layer 10 that underlies a gate stack (140, 142) and located between a pair of a source region 132 and a drain region 138 constitutes a semiconductor channel 135. The logic region may include p-type field effect transistors (i.e., field effect transistors including a p-doped source region, a p-doped drain region, and an n-doped channel region) and n-type field effect transistors (i.e., field effect transistors including an n-doped source region, an n-doped drain region, and a p-doped channel region).

A subset of the masked ion implantation processes used to form the source regions 132 and the drain regions 138 of the field effect transistors may be used to implant dopants of a second conductivity type into discrete surface portions of the substrate semiconductor layer 10 in the memory array region. The second conductivity type is the opposite of the first conductivity type. For example, if the first conductivity type is p-type, the second conductivity type is n-type, and vice versa.

The dopants of the second conductivity type that are implanted into the memory array region may form active region (62, 66). The active regions (62, 66) may function as source regions or drain regions during operation of the flash memory cells. The active regions (62, 66) may include axial active regions 62 that are laterally offset from a most proximal one of the floating gate electrodes 22 along the axial direction, such as the first horizontal direction hd1. Further, the active regions (62, 66) may include lateral active regions 66 that are laterally offset from a most proximal one of the floating gate electrodes 22 along a lateral direction, which is the horizontal direction that is perpendicular to the axial direction. In the illustrative example, the lateral direction may be the second horizontal direction hd2.

In one embodiment, each lateral active region 66 may be formed between a pair of tunneling dielectrics 20 that is laterally spaced apart along the lateral direction such as the second horizontal direction hd2. Each axial active region 62 may be spaced from a most proximal floating gate electrode 22 along the axial direction such as the first horizontal direction hd1. The axial active region 62 may be located on the opposite side of an erase gate electrode 32 with respective to the most proximal floating gate electrode 22. A lateral active region 66 may contact sidewalls of a pair of tunneling dielectrics 20. The sidewalls of the tunneling dielectrics 20 that contact a respective lateral active region 66 may be parallel to the first horizontal direction hd1. An axial active region 62 may contact a sidewall of a most proximal tunneling dielectric 20. The sidewalls of the tunneling dielectric 20 that contact a respective axial active region 62 may be parallel to the second horizontal direction hd2. The axial active regions 62 may contact a respective one of the shallow trench isolation structures 12.

A p-n junction may be formed at each interface between the active regions (62, 66) and the substrate semiconductor layer 10. The axial active regions 62 may be formed as a two-dimensional periodic array of axial active regions 62 having the first pitch P1 along the first horizontal direction hd1 and having the second pitch P2 along the second horizontal direction hd2. The lateral active regions 66 may be formed as a two-dimensional array of lateral active regions 66 having the first pitch P1 along the first horizontal direction hd1 and having the second pitch P2 along the second horizontal direction hd2.

A pair of active regions (such as a pair of lateral active regions 66) may be formed within the substrate semiconductor layer 10 by implanting dopants having a doping of the second conductivity type for each flash memory cell. The pair of active regions may be laterally spaced apart by the floating gate electrode 22 located therebetween. For example, the pair of active regions is formed on opposing sides of the floating gate electrode 22, and is laterally spaced apart along the second horizontal direction hd2 that is perpendicular to the first horizontal direction hd1.

In embodiments in which a plurality of flash memory cells may be formed in a two-dimensional array configuration, the lateral active regions 66 may be shared by a neighboring pair of flash memory cells that are laterally spaced along the second horizontal direction hd2. In such an embodiment, a two-dimensional array of active regions (such as a two-dimensional array of lateral active regions 66) may be formed within the substrate semiconductor layer 10. The two-dimensional array of lateral active regions 66 may have a doping of the second conductivity type, and may be laterally offset from the two-dimensional array of floating gate electrodes 22 along the second horizontal direction hd2 that is different from the first horizontal direction hd1. Each of the floating gate electrodes 22 may be located between a neighboring pair of lateral active regions 66 within the two-dimensional array of lateral active regions 66.

In one embodiment, each dielectric gate spacer 46 may contact all sidewalls of a respective floating gate electrode 22, each top surface of a pair of active regions (such as a pair of lateral active regions 66), and a top surface of an underlying tunneling dielectric 20 formed within the substrate semiconductor layer 10 and laterally surrounding the respective floating gate electrode 22.

Figure 12C:
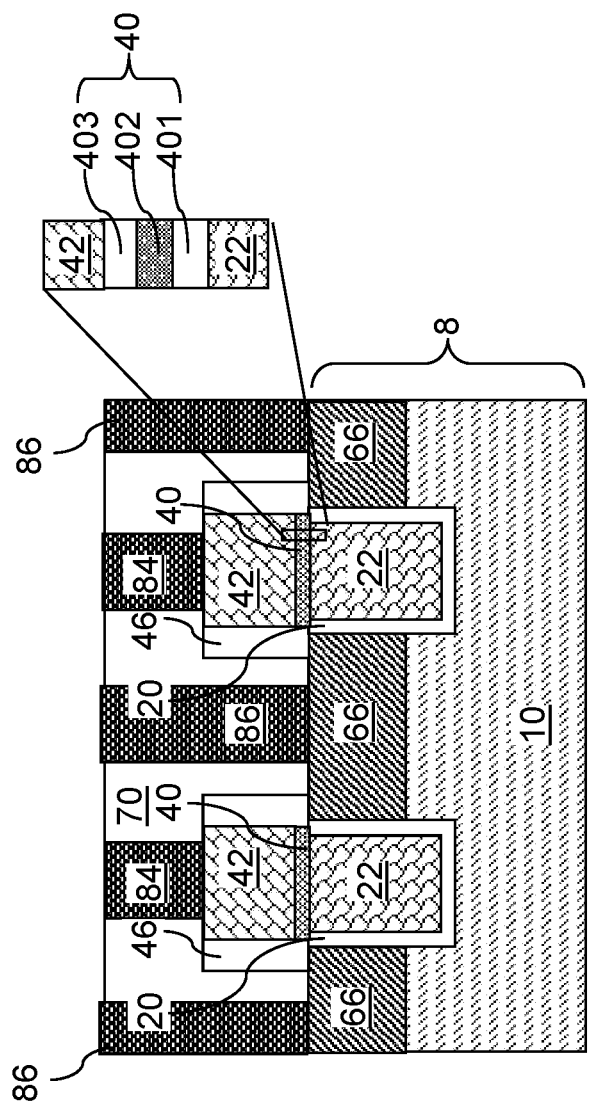
FIG. 12C is a vertical cross-sectional view of the exemplary structure along the plane C-C' of FIG. 12A.

Referring to FIGS. 12A-12C, a planarization dielectric layer 70 may be deposited over the two-dimensional array of control gate electrodes 42 and the semiconductor substrate 8. The planarization dielectric layer 70 includes a self-planarizing dielectric material or a dielectric material that may be planarized by a planarization process. For example, the planarization dielectric layer 70 may include flowable oxide (FOX), undoped silicate glass, or a doped silicate glass. In embodiments in which the planarization dielectric layer 70 may be planarized, a chemical mechanical planarization process may be performed to form a horizontal top surface that overlies the top surfaces of the control gate electrodes 42. The planarization dielectric layer 70 laterally surrounds, and overlies, each of the control gate electrodes 42 and the dielectric gate spacers 46. The planarization dielectric layer 70 may contact a top surface of each erase gate electrode 32.

A photoresist layer (not shown) may be applied over the planarization dielectric layer 70, and may be lithographically patterned to form openings in areas that overlie the control gate electrodes 42, the erase gate electrodes 32, the axial active regions 62, and the lateral active regions 66. An anisotropic etch process may be performed to transfer the pattern of the openings in the photoresist layer through the planarization dielectric layer 70. Via cavities vertically extending through the planarization dielectric layer 70 may be formed. The via cavities include control gate contact via cavities that extend to a respective one of the control gate electrodes 42, erase gate contact via cavities that extend to a respective one of the erase gate electrodes 32, axial contact via cavities that extend to a respective one of the axial active regions 62, and lateral contact via cavities that extend to a respective one of the lateral active regions 66.

Optionally, metal-semiconductor alloy regions (not illustrated) may be formed on physically exposed surfaces of the control gate electrodes 42, the erase gate electrodes 32, the axial active regions 62, and the lateral active regions 66. A metallic material that forms a metal-semiconductor alloy with a semiconductor material may be deposited on the physically exposed top surfaces of the control gate electrodes 42, the erase gate electrodes 32, the axial active regions 62, and the lateral active regions 66, and an anneal process may be performed to induce formation of a metal-semiconductor alloy material. In one embodiment, the metal-semiconductor alloy may include a metal silicide. The metallic material may include, for example, tungsten, titanium, cobalt, nickel, or a metallic alloy thereof. Other suitable materials are within the contemplated scope of disclosure. Unreacted portions of the metallic material may be removed selective to the metal-semiconductor alloy material using a selective wet etch process.

At least one metallic material may be deposited in the remaining volumes of the various via cavities. The at least one metallic material may include, for example, a metal nitride liner such as TiN, TaN, or WN, and a metallic fill material such as W, Cu, Co, Ru, or Mo. Other suitable materials are within the contemplated scope of disclosure. Excess portions of the at least one metallic material overlying the top surface of the planarization dielectric layer 70 may be removed by a planarization process, which may use a chemical mechanical planarization process and/or a recess etch process. Remaining portions of the at least one metallic material in the various via cavities comprise contact via structures (84, 88, 82, 86). The various contact via structures (84, 88, 82, 86) comprise control gate contact via structures 84 that contact a top surface of a respective one of the control gate electrodes 42, erase gate contact via structures 88 that contact a top surface of a respective one of the erase gate electrodes 32, axial active region contact via structures 82 that contact a top surface of a respective one of the axial active regions 62, and lateral active region contact via structures 86 that contact a top surface of a respective one of the lateral active regions 66.

Each flash memory cell comprises a control gate contact via structure 84 formed within the planarization dielectric layer 70 and contacting a control gate electrode 42, a pair of active region contact via structures (such as a pair of lateral active region contact via structures 86) formed in the planarization dielectric layer 70 and contacting top surfaces of a pair of active regions (such as a pair of lateral active regions 66), and an erase gate contact via structure 88 formed in the planarization dielectric layer 70 and contacting a top surface of an erase gate electrode 32.

In embodiments in which a two-dimensional array of flash memory cells may be formed, the lateral active regions 66 may be shared between a neighboring pair of flash memory cells. In one embodiment, the array of flash memory cells comprises a two-dimensional periodic array of unit flash memory cells UC. The unit flash memory cell UC may be repeated within the two-dimensional periodic array with the first pitch P1 along the first horizontal direction hd1 and with the second pitch P2 along the second horizontal direction hd2. Each of the two-dimensional array of floating gate electrodes 22, the two-dimensional array of erase gate electrodes 32, the two-dimensional array of lateral active regions 66, and the two-dimensional array of control gate electrodes 42 may have the same first pitch P1 along the first horizontal direction hd1 and the same second pitch P2 along the second horizontal direction hd2.

Each unit flash memory cell UC in the two-dimensional periodic array comprises a floating gate electrode 22 in the two-dimensional array of floating gate electrodes 22, an erase gate electrode 32 in the two-dimensional array of erase gate electrodes 32, an active region (such as a lateral active region 66) in a two-dimensional array of active regions (such as the lateral active regions 66), and a control gate electrode 42 in the two-dimensional array of control gate electrodes 42. Each active region (such as each lateral active region 66) located between a pair of floating gate electrodes 22 that is laterally spaced apart along the second horizontal direction hd2 may contact a pair of tunneling dielectrics 20 that contact a respective floating gate electrode 22 within the pair of floating gate electrodes 22.

Each floating gate electrode 22 within the array of flash memory cells may be located within a respective first opening 19 that vertically extends from a top surface of the substrate semiconductor layer 10 toward a backside surface of the substrate semiconductor layer 10, and each erase gate electrode 32 within the array of flash memory cells may be located within a respective second opening 29 that vertically extends from the top surface of the substrate semiconductor layer 10 toward the backside surface of the substrate semiconductor layer 10.

According to various embodiments of the present disclosure, a flash memory device is provided, which comprises: a floating gate electrode 22 formed within a substrate semiconductor layer 10 having a doping of a first conductivity type; a pair of active regions (such as a pair of lateral active regions 66) formed within the substrate semiconductor layer 10, having a doping of a second conductivity type, and laterally spaced apart by the floating gate electrode 22; an erase gate electrode 32 formed within the substrate semiconductor layer 10 and laterally offset from the floating gate electrode 22 (for example, along a first horizontal direction hd1); and a control gate electrode 42 that overlies the floating gate electrode 22.

According to various embodiments of the present disclosure, an array of flash memory cells is provided, which comprises: a two-dimensional array of floating gate electrodes 22 that may be formed within a substrate semiconductor layer 10 having a doping of a first conductivity type; a two-dimensional array of erase gate electrodes 32 that may be formed within the substrate semiconductor layer 10 and is laterally offset from the two-dimensional array of floating gate electrodes 22 along a first horizontal direction hd1; a two-dimensional array of active regions (such as the lateral active regions 66) that may be formed within the substrate semiconductor layer 10, having a doping of a second conductivity type, and is laterally offset from the two-dimensional array of floating gate electrodes 22 along a second horizontal direction hd2 that is different from the first horizontal direction hd1, wherein each of the floating gate electrodes 22 is located between a neighboring pair of active regions within the two-dimensional array of active regions; and a two-dimensional array of control gate electrodes 42 that overlie a respective one of the floating gate electrodes 22.

Figure 13:
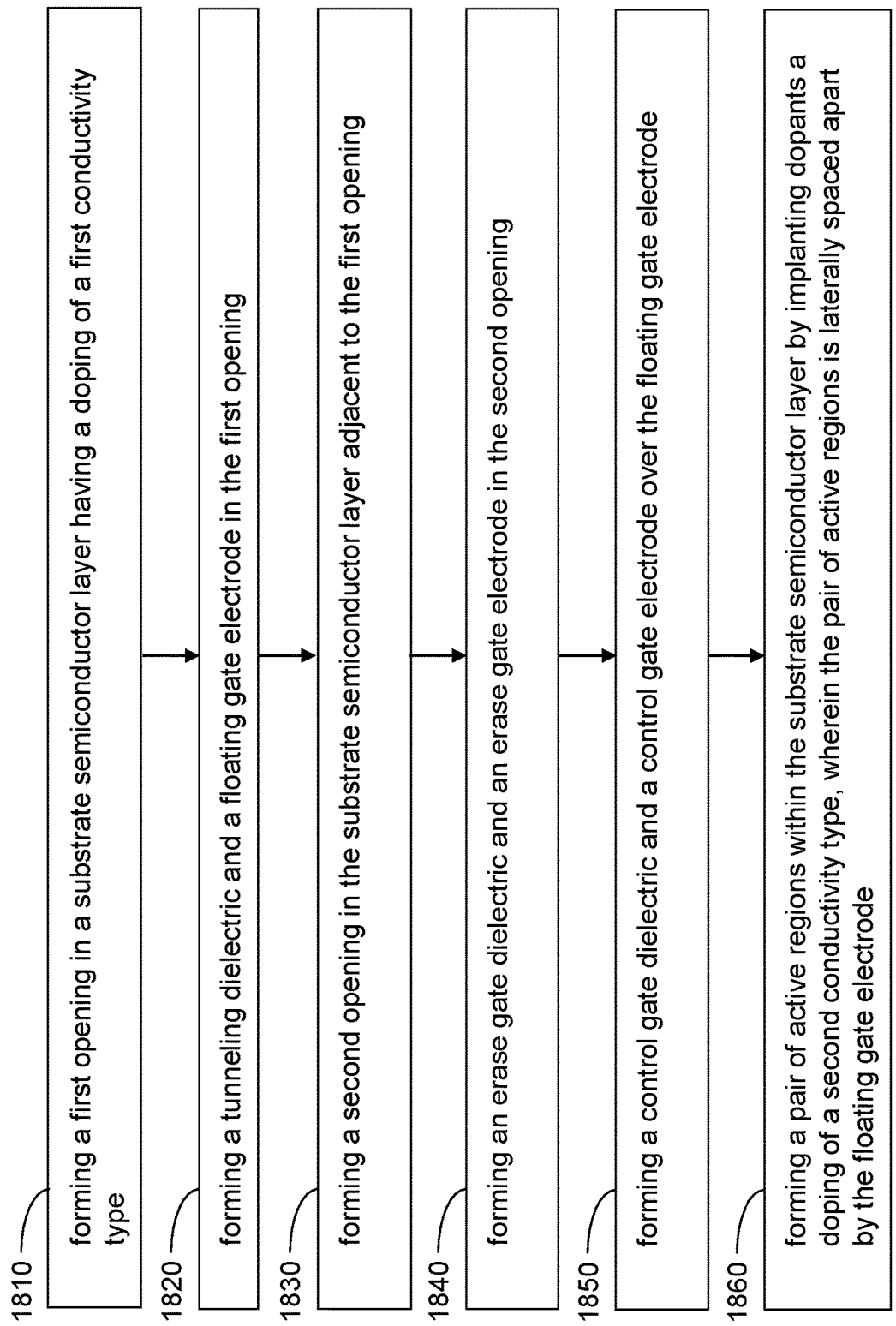
FIG. 13 is a flowchart illustrating steps for forming the exemplary structure according to an embodiment of the present disclosure.

Referring to FIG. 13, a flowchart illustrates steps for forming the exemplary structure of the present disclosure. Referring to step 1810, a first opening 19 may be formed in a substrate semiconductor layer 10 having a doping of a first conductivity type. Referring to step 1820, a tunneling dielectric 20 and a floating gate electrode 22 may be formed in the first opening 19. Referring to step 1830, a second opening 29 may be formed in the substrate semiconductor layer 10 adjacent to the first opening 19. Referring to step 1840, an erase gate dielectric 30 and an erase gate electrode 32 may be formed in the second opening 29. Referring to step 1850, a control gate dielectric 40 and a control gate electrode 42 may be formed over the floating gate electrode 22. Referring to step 1860, a pair of active regions (such as a pair of lateral active regions 66) may be formed within the substrate semiconductor layer 10 by implanting dopants having a doping of a second conductivity type, wherein the pair of active regions is laterally spaced apart by the floating gate electrode 22.

Each flash memory cell may be programmed by providing an electrical bias across a pair of active regions adjacent to a floating gate electrode 22. For example, a pair of lateral active regions 66 adjacent to a floating gate electrode 22 may be electrically biased to provide a potential difference therebetween, and a control gate electrode 42 that overlies the floating gate electrode 22 may be electrically biased to induce tunneling of charge carriers (such as electrons) from a channel portion of the substrate semiconductor layer 10 that underlies the floating gate electrode 22 through the tunneling dielectric 20 into the floating gate electrode 22. Alternatively, a pair of an axial active region 62 and a lateral active region 66 may be used to provide a potential difference therebetween while a programming voltage is applied to the control gate electrode 42 to induce tunneling of charge carriers into the floating gate electrode 22.

Each flash memory cell may be sensed by electrically biasing a pair of lateral active regions 66 adjacent to a floating gate electrode 22 to provide a potential difference therebetween, and by applying a sensing voltage to the control gate electrode 42 that overlies the floating gate electrode 22. The sensing voltage has a lesser magnitude than the programming voltage, and is insufficient to induce tunneling of charge carriers (such as electrons) into the floating gate electrode 22. The amount of electrical charges in the floating gate electrode 22 modulates the magnitude of electrical current through the channel portion of the substrate semiconductor layer 10 that underlies the floating gate electrode 22. Thus, the state of the flash memory cell as represented by the amount of trapped electrical charges in the floating gate electrode 22 may be determined by the sensing operation. Alternatively, a pair of an axial active region 62 and a lateral active region 66 may be used to provide a potential difference for a sensing operation while a sensing voltage (with a lesser magnitude than the programming voltage) is applied to the control gate electrode 42 to measure the magnitude of the electrical current through the channel portion of the substrate semiconductor layer 10 that underlies the floating gate electrode 22.

Each flash memory cell may be erased by electrically biasing the erase gate electrode 32. For example, if electrons are trapped in the floating gate electrode 22, a large positive bias may be applied to the erase gate electrode 32 to induce tunneling of the electrons from the floating gate electrode 22 into the erase gate electrode 32. A negative bias voltage may be applied to the control gate electrode 42 to assist tunneling of the electrons from the floating gate electrode 22 into the erase gate electrode 32.

The various structures and methods of the present disclosure may be used to provide a flash memory device in which each floating gate electrode 22 and each erase gate electrode 32 are buried within the substrate semiconductor layer 10 underneath a horizontal plane including the planar top surface of the substrate semiconductor layer 10. Tunneling of charge carriers into the floating gate electrode 22 during a programming operation may be performed using vertical portions of the tunneling dielectric 20 that laterally extend along the first horizontal direction hd1 and the horizontal bottom portion of the tunneling dielectric 20. Tunneling of charge carriers out of the floating gate electrode 22 during an erase operation may be performed using a different vertical portion of the tunneling dielectric 20 that laterally extend along the second horizontal direction hd2. Thus, the lifespan of the tunneling dielectric 20 may be prolonged, and the flash memory device may be operated over more programming and erase operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a flash memory device, comprising:
   forming a first opening in a substrate semiconductor layer having a doping of a first conductivity type;
   forming a tunneling dielectric and a floating gate electrode in the first opening;
   forming a second opening in the substrate semiconductor layer adjacent to the first opening;
   forming an erase gate dielectric and an erase gate electrode in the second opening;
   forming a control gate dielectric and a control gate electrode over the floating gate electrode;
   forming a dielectric gate spacer around the control gate dielectric and the control gate electrode, and directly on a top surface of the tunneling gate dielectric and directly on a top surface of the erase gate dielectric; and
   forming a pair of active regions within the substrate semiconductor layer by implanting dopants having a doping of a second conductivity type, wherein the pair of active regions is laterally spaced apart by the floating gate electrode.

2. The method of claim 1, further comprising:
   depositing a tunneling dielectric layer on a bottom surface and sidewalls of the first opening and over a top surface of the substrate semiconductor layer;
   depositing a floating gate electrode layer on the tunneling dielectric layer; and
   removing portions of the floating gate electrode layer and the tunneling dielectric layer from above a horizontal plane including the top surface of the substrate semiconductor layer, wherein a remaining portion of the floating gate electrode layer comprises the floating gate electrode, and a remaining portion of the tunneling dielectric layer comprises the tunneling dielectric.

3. The method of claim 1, further comprising:
   depositing an erase gate dielectric layer on a bottom surface and sidewalls of the second opening and over a top surface of the substrate semiconductor layer;
   depositing an erase gate electrode layer on the erase gate dielectric layer; and
   removing portions of the erase gate electrode layer and the erase gate dielectric layer from above a horizontal plane including the top surface of the substrate semiconductor layer, wherein a remaining portion of the erase gate electrode layer comprises the erase gate electrode, and a remaining portion of the erase gate dielectric layer comprises the erase gate dielectric.

4. The method of claim 3, wherein:
   the erase gate dielectric layer is formed directly on a top surface of the floating gate electrode; and
   the portions of the erase gate electrode layer and the erase gate dielectric layer are removed from above the horizontal plane including the top surface of the substrate semiconductor layer by a planarization process.

5. The method of claim 1, further comprising:
   depositing a control gate dielectric layer over the floating gate electrode, the erase gate electrode, and the substrate semiconductor layer;
   depositing a control gate electrode layer on the control gate dielectric layer;
   masking a portion of the control gate electrode layer that overlies the floating gate electrode with a patterned photoresist layer; and
   anisotropically etching the control gate electrode layer and the control gate dielectric layer using the patterned photoresist layer as an etch mask, wherein a patterned portion of the control gate electrode layer comprises the control gate electrode, and a patterned portion of the control gate dielectric layer comprises the control gate dielectric.

6. The method of claim 5, wherein the control gate dielectric layer is formed directly on a top surface of the floating gate electrode and directly on a top surface of the erase gate electrode.

7. The method of claim 1, wherein:
   the erase gate electrode is formed at a location that is laterally spaced apart from the floating gate electrode along a first horizontal direction; and
   the pair of active regions is formed on opposing sides of the floating gate electrode, and is laterally spaced apart along a second horizontal direction that is perpendicular to the first horizontal direction.

8. The method of claim 1, wherein the erase gate dielectric is formed on a sidewall of the tunneling gate dielectric.

9. The method of claim 1, wherein:
   the pair of active regions are laterally spaced apparat along an axial direction; and
   the method further comprises forming a lateral active region within he substrate semiconductor layer, wherein the lateral active region is laterally offset from the floating gate electrode along a lateral direction that is different from the axial direction.

10. The method of claim 1, wherein:
    the second opening is formed at a location that is laterally offset from the first opening along an axial direction;
    the pair of active regions is laterally spaced apart from each other along a lateral direction that is different from the axial direction; and
    the method comprises forming an additional active region on the tunneling dielectric, wherein the additional active region is laterally spaced from the erase gate electrode along the axial direction.

11. A method of forming a flash memory device, comprising:
    forming a first opening in a substrate semiconductor layer having a doping of a first conductivity type;
    forming a tunneling dielectric and a floating gate electrode in the first opening;
    forming a second opening in the substrate semiconductor layer adjacent to the first opening such that a sidewall of the tunneling dielectric is physically exposed;
    forming an erase gate dielectric and an erase gate electrode in the second opening;

forming a control gate dielectric and a control gate electrode above a horizontal plane including a top surface of the substrate semiconductor layer;

forming a dielectric gate spacer around the control gate electrode, wherein the dielectric gate spacer contacts a top surface of the erase gate dielectric and a portion of an outer periphery of a top surface of the tunneling dielectric; and forming at least two active regions within the substrate semiconductor layer by implanting dopants having a doping of a second conductivity type.

12. The method of claim 11, wherein each of the at least two active regions is formed directly on a respective sidewall of the tunneling dielectric.

13. The method of claim 12, wherein:

the at least two active regions comprise three active regions that are formed simultaneously by implanting the dopants having the doping of a second conductivity type; and the three active regions comprise:

an axial active region that is laterally offset from the floating gate electrode along a first horizontal direction; and two lateral active regions that are laterally offset from each other along a second horizontal direction that is different from the first horizontal direction.

14. The method of claim 11, wherein the control gate dielectric is formed by depositing and patterning a control gate dielectric layer such that the control gate dielectric contacts an entirety of a top surface of the floating gate electrode and an entirety of an inner periphery of the tunneling dielectric.

15. The method of claim 11, wherein:

the second opening is laterally offset from the first opening along an axial direction; and the at least two active regions comprises an axial active region that is laterally offset from the floating gate electrode along the axial direction, and a lateral active region that is laterally offset from the floating gate electrode along a lateral direction that is different from the axial direction.

16. A method of forming a flash memory device, comprising:

forming a first opening in a substrate semiconductor layer having a doping of a first conductivity type;

forming a tunneling dielectric and a floating gate electrode in the first opening;

forming a second opening in the substrate semiconductor layer adjacent to the first opening, wherein the second opening is laterally offset from the first opening along an axial direction;

forming an erase gate dielectric and an erase gate electrode in the second opening;

forming a control gate dielectric and a control gate electrode above a horizontal plane including a top surface of the substrate semiconductor layer; and forming at least two active regions within the substrate semiconductor layer by implanting dopants having a doping of a second conductivity type, wherein the at least two active regions comprises an axial active region that is laterally offset from the floating gate electrode along the axial direction, and a lateral active region that is laterally offset from the floating gate electrode along a lateral direction that is different from the axial direction.

17. The method of claim 16, wherein:

a sidewall of the tunneling dielectric is physically exposed upon formation of the second opening; and the erase gate dielectric is formed directly on the sidewall of the tunneling dielectric.

18. The method of claim 16, wherein:

the at least two active regions comprise an additional lateral active region that is laterally offset from the floating gate electrode along a direction that is an opposite direction of the lateral direction;

the axial active region is formed directly on a first sidewall of the tunning gate dielectric;

the lateral active region is formed directly on a second sidewall of the tunneling gate dielectric; and the additional lateral active region is formed directly on a third sidewall of the tunneling gate dielectric.

19. The method of claim 16, further comprising:

forming an additional first opening in the substrate semiconductor layer; and forming an additional tunneling dielectric and an additional floating gate electrode in the additional first opening, wherein the lateral active region is formed directly on a sidewall of the tunneling dielectric and directly on a sidewall of the additional tunneling dielectric.

20. The method of claim 19, further comprising forming an additional axial active region directly on another sidewall of the additional tunneling dielectric, wherein the axial active region and the additional active region contact, and are laterally spaced from each other along the lateral direction by, a portion of the semiconductor material layer having a top surface that continuously extends from a top periphery of the axial active region to a top periphery of the additional active region.

* * * * *